(12) United States Patent
Fan

(10) Patent No.: US 11,282,743 B2
(45) Date of Patent: Mar. 22, 2022

(54) SEMICONDUCTOR DEVICE WITH MULTI-LAYER CONNECTING STRUCTURE AND METHOD FOR FABRICATING THE SAME

(71) Applicant: NANYA TECHNOLOGY CORPORATION, New Taipei (TW)

(72) Inventor: Cheng-Hsiang Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/932,376

(22) Filed: Jul. 17, 2020

(65) Prior Publication Data
US 2022/0020636 A1 Jan. 20, 2022

(51) Int. Cl.
*H01L 21/768* (2006.01)
*H01L 21/311* (2006.01)
*H01L 21/02* (2006.01)

(52) U.S. Cl.
CPC .. *H01L 21/76832* (2013.01); *H01L 21/02126* (2013.01); *H01L 21/31111* (2013.01); *H01L 21/31144* (2013.01); *H01L 21/76834* (2013.01)

(58) Field of Classification Search
CPC ....... H01L 21/768321; H01L 21/02126; H01L 21/31111; H01L 21/31144; H01L 21/76834
See application file for complete search history.

(56) References Cited

U.S. PATENT DOCUMENTS

| | | | | |
|---|---|---|---|---|
| 2002/0008280 A1* | 1/2002 | Armacost | ........... | H01L 27/1203 257/330 |
| 2014/0110778 A1* | 4/2014 | Fumitake | ........ | H01L 21/823842 257/330 |

* cited by examiner

*Primary Examiner* — Zandra V Smith
*Assistant Examiner* — Andre C Stevenson
(74) *Attorney, Agent, or Firm* — Muncy, Geissler, Olds & Lowe, P.C.

(57) ABSTRACT

The present application discloses a semiconductor device with the multi-layered connecting structure and a method for fabricating the semiconductor device. The semiconductor device includes a substrate, a single-layered connecting structure positioned above the substrate, and a multi-layered connecting structure positioned above the substrate and including a plurality of first conductive layers and a plurality of second conductive layers alternatively stacked. A top surface of the multi-layered connecting structure is substantially coplanar with a top surface of the single-layered connecting structure and a width of the multi-layered connecting structure is less than a width of the single-layered connecting structure.

16 Claims, 20 Drawing Sheets

SEMICONDUCTOR DEVICE WITH MULTI-LAYER CONNECTING STRUCTURE AND METHOD FOR FABRICATING THE SAME

TECHNICAL FIELD

The present disclosure relates to a semiconductor device and a method for fabricating the semiconductor device with a multi-layered connecting structure, and more particularly, to a semiconductor device with the multi-layered connecting structure and a method for fabricating the semiconductor device.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a single-layered connecting structure positioned above the substrate, and a multi-layered connecting structure including a first conductive layer positioned above the substrate and a second conductive layer positioned on the first conductive layer. A top surface of the multi-layered connecting structure is substantially coplanar with a top surface of the single-layered connecting structure and a width of the multi-layered connecting structure is less than a width of the single-layered connecting structure.

In some embodiments, the first conductive layer and second conductive layer have opposite stress states.

Another aspect of the present disclosure provides a semiconductor device including a substrate, a single-layered connecting structure positioned above the substrate, and a multi-layered connecting structure positioned above the substrate and including a plurality of first conductive layers and a plurality of second conductive layers alternatively stacked. A top surface of the multi-layered connecting structure is substantially coplanar with a top surface of the single-layered connecting structure and a width of the multi-layered connecting structure is less than a width of the single-layered connecting structure.

In some embodiments, the plurality of first conductive layers and the plurality of second conductive layers have opposite stress states.

In some embodiments, top surfaces of the plurality of first conductive layers are rough.

In some embodiments, thicknesses of the plurality of first conductive layers are greater than or equal to thicknesses of the plurality of second conductive layers.

In some embodiments, thicknesses of the plurality of first conductive layers are between about 5 nm and about 50 nm and thicknesses of the plurality of second conductive layers are between about 10 nm and 150 nm.

In some embodiments, sidewalls of the multi-layered connecting structure are substantially vertical.

In some embodiments, the semiconductor device includes first spacers positioned on sidewalls of the multi-layered connecting structure.

In some embodiments, the semiconductor device includes porous spacers positioned on sidewalls of the multi-layered connecting structure.

In some embodiments, a porosity of the porous spacers is between about 10% and about 90%.

In some embodiments, the semiconductor device includes air gaps positioned between the sidewalls of the multi-layered connecting structure and the first spacers.

Another aspect of the present disclosure provides a method for fabricating a semiconductor device including providing a substrate, forming a multi-layered connecting structure above the substrate and including a plurality of first conductive layers alternatively formed with a plurality of second conductive layers, and forming a single-layered connecting structure above the substrate and having a top surface of the single-layered connecting structure substantially coplanar with a top surface of the multi-layered connecting structure and a width of the single-layered connecting structure greater than a width of the multi-layered connecting structure.

In some embodiments, the plurality of first conductive layers and the plurality of second conductive layers have opposite stress states.

In some embodiments, the step of forming the multi-layered connecting structure including alternatively forming layers of first conductive material and layers of second conductive material above the substrate, forming a hard-mask layer over the layers of first conductive material and the layers of second conductive material, patterning the hard mask layer, performing an etch process using the hard mask layer as a mask to turn the layers of first conductive material and the layers of second conductive material into the plurality of first conductive layers and the plurality of second conductive layers.

In some embodiments, the method for fabricating the semiconductor device includes a step of forming first spacers on sidewalls of the multi-layered connecting structure.

In some embodiments, the method for fabricating the semiconductor device includes a step of forming porous spacers on sidewalls of the multi-layered connecting structure.

In some embodiments, the step of forming the porous spacers including forming a layer of energy-removable material covering the multi-layered connecting structure, performing an anisotropic etch process to turn the layer of energy-removable material into sacrificial spacers on the sidewalls of the multi-layered connecting structure, performing an energy treatment to turn the sacrificial spacers into the porous spacers.

In some embodiments, an energy source of the energy treatment is heat, light, or a combination thereof.

In some embodiments, the layer of energy-removable material includes a base material and a decomposable porogen material, and the base material includes methylsilsesquioxane, low-dielectric materials, or silicon oxide.

Due to the design of the semiconductor device of the present disclosure, the multi-layered structure of the multi-layered connecting structure may prevent the formation of voids and may be suitable for fabrication of semiconductor devices having small technical nodes. In addition, the porous spacers or the air gaps may reduce the parasitic capacitance of the semiconductor device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
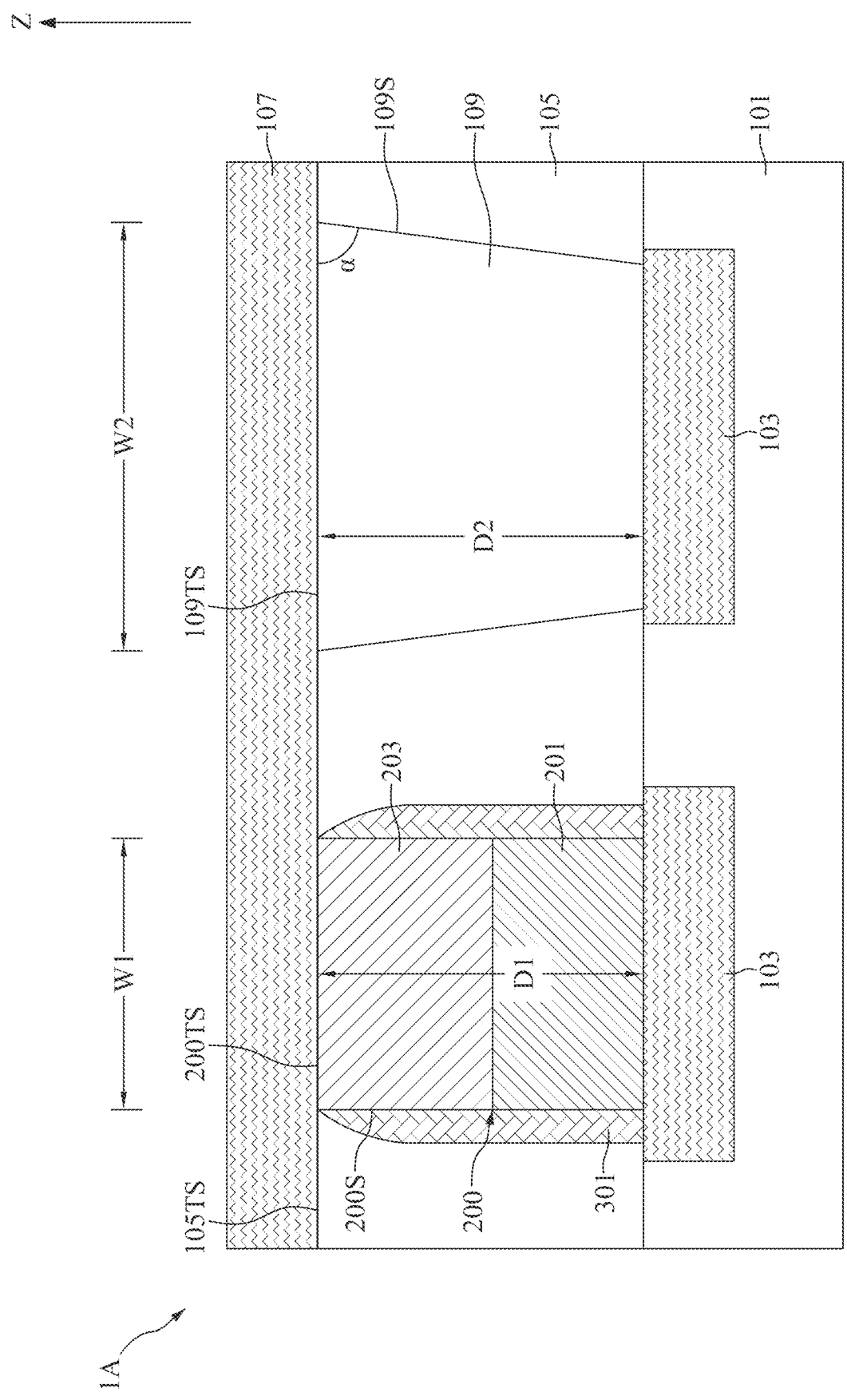
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction. Z, and below (or down) corresponds to the opposite direction of the arrow of the direction Z.

FIG. 1 illustrates, in a schematic cross-sectional view diagram, a semiconductor device 1A in accordance with one embodiment of the present disclosure.

With reference to FIG. 1, the semiconductor device 1A may include a substrate 101, first conductive lines 103, a first insulating layer 105, a second conductive line 107, a single-layered connecting structure 109, a multi-layered connecting structure 200, and first spacers 301.

With reference to FIG. 1, in some embodiments, the substrate 101 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; a non-semiconductor material, such as soda-lime glass, fused silica, fused quartz, calcium fluoride; other suitable materials; or combinations thereof.

In some embodiments, the substrate 101 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

In some embodiments, the substrate 101 may include dielectrics, insulating layers, or conductive features disposed on the bulk semiconductor substrate or the topmost semiconductor material layer. The dielectrics or the insulating layers may be formed of, for example, silicon oxide, borophosphosilicate glass, undoped silicate glass, fluorinated silicate glass, low-k dielectric materials, the like, or a combination thereof. Each of the dielectrics or each of the insulating layers may have a thickness between about 0.5 micrometer and about 3.0 micrometer. The low-k dielectric materials may have a dielectric constant less than 3.0 or even less than 2.5. The conductive features may be conductive lines, conductive vias, conductive contacts, or the like.

In some embodiments, device elements (not shown) may be disposed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation.

With reference to FIG. 1, the first conductive lines 103 may be disposed in the substrate 101. The top surfaces of the first conductive lines 103 may be substantially coplanar with the top surface of the substrate 101. It should be noted that the number of the first conductive lines 103 shown in FIG. 1 is merely illustrative. The first conductive lines 103 may be formed of, for example, copper, aluminum, titanium, tungsten, the like, or a combination thereof.

With reference to FIG. 1, the first insulating layer 105 may be disposed on the substrate 101. The first insulating layer 105 may be formed of, for example, silicon oxide, borophosphosilicate glass, undoped silicate glass, fluorinated silicate glass, low-k dielectric materials, the like, or a combination thereof. The first insulating layer 105 has a thickness between about 0.5 micrometer and about 3.0 micrometer.

With reference to FIG. 1, the single-layered connecting structure 109 may be disposed in the first insulating layer 105. The top surface 109TS of the single-layered connecting structure 109 may be substantially coplanar with the top surface 105TS of the first insulating layer 105. The sidewalls 109S of the single-layered connecting structure 109 may have a slanted cross-sectional profile. In some embodiments, a width W2 of the single-layered connecting structure 109 may gradually become wider from bottom to top along the direction Z. In some embodiments, the single-layered connecting structure 109 as a whole may have a uniform slope. In some embodiments, an angle α between the sidewalls 109S of the single-layered connecting structure 109 and a top surface 109TS of the single-layered connecting structure 109 may be between 86 degree and about 90 degree. In some embodiments, the single-layered connecting structure 109 may be a conductive via and may be electrically connected the corresponding first conductive line 103 and the second conductive line 107. In some embodiments, the single-layered connecting structure 109 may be a conductive contact and may be electrically connected to a source/drain region in the substrate 101.

With reference to FIG. 1, the multi-layered connecting structure 200 may be disposed on the substrate 101. A top surface 200TS of the multi-layered connecting structure 200 may be substantially coplanar with the top surface 109TS of the single-layered connecting structure 109. In some embodiments, a width W1 of the multi-layered connecting structure 200 may be less than or equal to the width W2 of the single-layered connecting structure 109. A depth D1 of the multi-layered connecting structure 200 may be equal to a depth D2 of the single-layered connecting structure 109. In some embodiments, the multi-layered connecting structure 200 may be a conductive via and may be electrically connected the corresponding first conductive line 103 and the second conductive line 107.

It should be noted that, in the description of the present disclosure, a "depth" refers to a vertical size of an element (e.g., a layer, trench, hole, opening, etc.) in a cross-sectional perspective measured from a top surface to a bottom surface of the element; a "width" refers to a size of an element (e.g., a layer, trench, hole, opening, etc.) in a cross-sectional perspective measured from a side surface to an opposite surface of the element. The term "thickness" may substitute for "width" and/or "depth" where indicated.

In some embodiments, the multi-layered connecting structure 200 may be a conductive contact and may be electrically connected to a source/drain region in the substrate 101. In some embodiments, the multi-layered connecting structure 200 and the single-layered connecting structure 109 may electrically connected to the same first conductive line 103 or may electrically connected to different second conductive lines 107.

With reference to FIG. 1, the multi-layered connecting structure 200 may include a first conductive layer 201 and a second conductive layer 203. The first conductive layer 201 may be disposed on the substrate 101. The second conductive layer 203 may be disposed on the first conductive layer 201. The top surface of the second conductive layer 203 may be referred to as the top surface 200TS of the multi-layered connecting structure 200. The sidewalls of the first conductive layer 201 and the sidewalls of the second conductive layer 203 together form sidewall 200S of the multi-layered connecting structure 200. The sidewalls of the multi-layered connecting structure 200 may be substantially vertical.

It should be noted that, in the description of the present disclosure, a surface (or sidewall) is "vertical" if there exists a vertical plane from which the surface does not deviate by more than three times the root mean square roughness of the surface.

In some embodiments, the first conductive layer 201 and the second conductive layer 203 may have different stress states. For example, the first conductive layer 201 may have tensile stress and the second conductive layer 203 may have compressive stress, or vice versa. The first conductive layer 201 and the second conductive layer 203 may be formed including, for example, titanium, titanium nitride, ruthenium, molybdenum, chromium, vanadium, palladium, platinum, rhodium, scandium, aluminum, niobium, niobium nitride, tungsten, tungsten nitride, tantalum, tantalum nitride, or silicides thereof. The first conductive layer 201 and the second conductive layer 203 may be formed of different materials but are not limited thereto.

The stress states of the first conductive layer 201 and the second conductive layer 203 may be controlled by a variety of methods. For example, the stress states of the first conductive layer 201 and the second conductive layer 203 may be controlled by forming the first conductive layer 201 and the second conductive layer 203 with different materials. Specifically, the first conductive layer 201 is formed of a material having a higher stress state and the second conductive layer 203 is formed a material having a lower stress state. In this example, the second conductive layer 203 having lower stress state may have a thicker thickness than the first conductive layer 201 having higher stress state to compensate for the stress of the first conductive layer 201 having higher stress state.

For another example, the stress states of the first conductive layer 201 and the second conductive layer 203 may be controlled by forming the first conductive layer 201 and the second conductive layer 203 as nitrides with different nitrogen levels. Specifically, the first conductive layer 201 may be formed of nitrides having higher nitrogen level so as to have a higher stress state due to a more disrupted crystallization. In contrast, the second conductive layer 203 may be formed of nitrides having lower nitrogen level so as to have a lower stress state. The different nitrogen levels of the first conductive layer 201 and the second conductive layer 203 may be controlled by the amount of the reactant during the deposition processes of the first conductive layer 201 and the second conductive layer 203. In this example, the first conductive layer 201 may have a same thickness as the second conductive layer 203 but is not limited thereto.

The first conductive layer 201 and the second conductive layer 203 that have different stress states may cancel the stress of the multi-layered connecting structure 200 or at least reduce to the stress of the multi-layered connecting structure 200 to a desired amount. Hence, the wafer bowing may be reduced or avoided. As a result, the yield of the semiconductor device 1A may be improved.

With reference to FIG. 1, the first spacers 301 may be disposed on the sidewalls 200S of the multi-layered connecting structure 200. The first spacers 301 may be formed of, for example, silicon oxide, silicon nitride, silicon carbon nitride, silicon nitride oxide, or silicon oxynitride. The first spacers 301 may electrically isolate the multi-layered connecting structure 200 from neighboring conductive elements (e.g., the single-layered connecting structure 109) disposed adjacent to two sides of the multi-layered connecting structure 200.

It should be noted that, in in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, the second conductive line 107 may be disposed on the first insulating layer 105. The second conductive line 107 may be electrically connected to the single-layered connecting structure 109 and the multi-layered connecting structure 200. The second conductive line 107 may be formed of a same material as the first conductive lines 103 but is not limited thereto.

FIGS. 2 to 5 illustrate, in schematic cross-sectional view diagrams, semiconductor devices 1B, 1C, 1D, and 1E in accordance with some embodiments of the present disclosure.

It should be noted that the same or similar reference numbers used throughout the drawings are used to denote the same or similar features, elements, or structures, and thus, a detailed explanation of the same or similar features, elements, or structures will not be repeated for each of the drawings.

Figure 2:
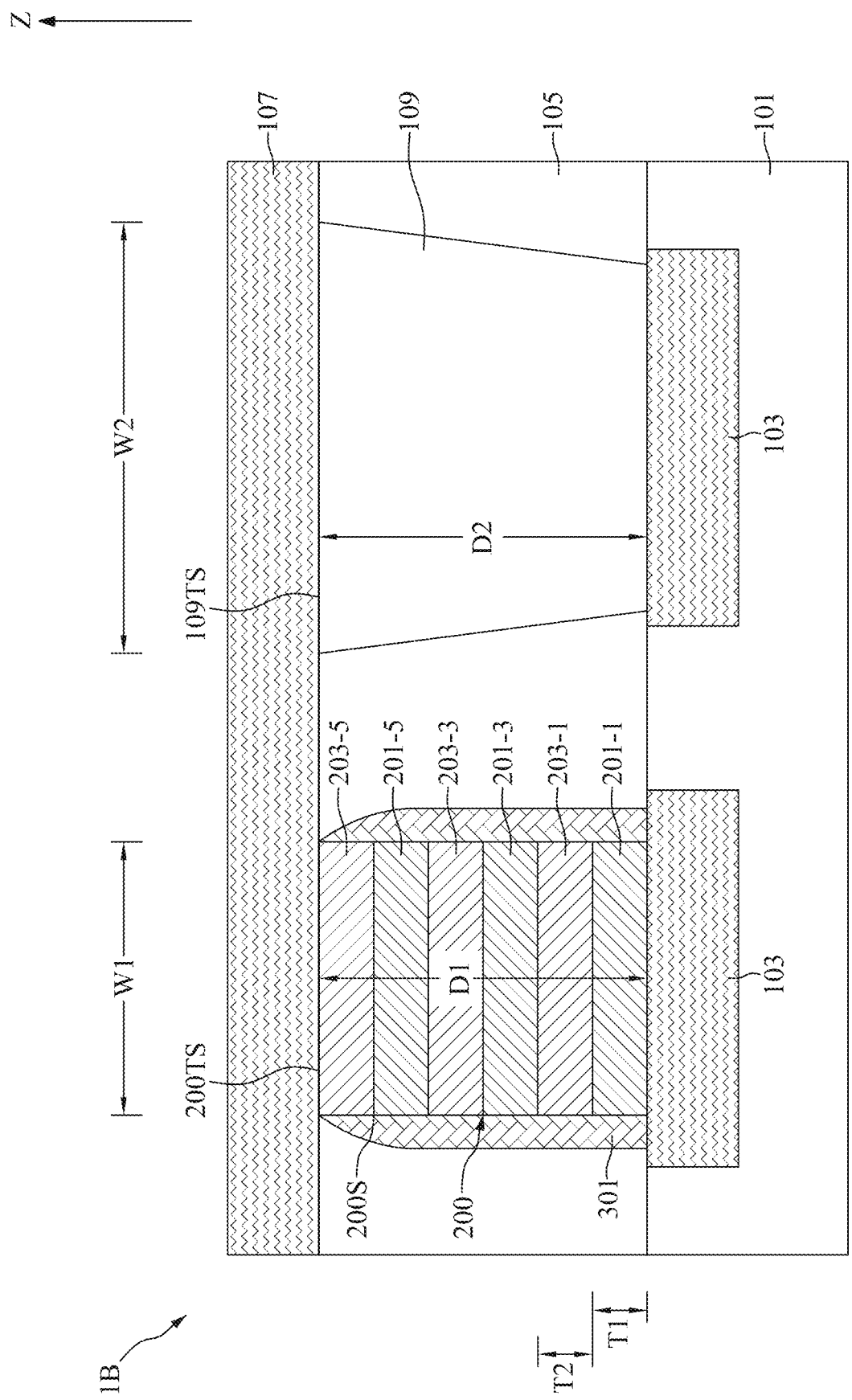
FIGS. 2 to 5 illustrate, in schematic cross-sectional view diagrams, semiconductor devices in accordance with some embodiments of the present disclosure.

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted.

With reference to FIG. 2, the top surface 200TS of the multi-layered connecting structure 200 may be substantially coplanar with the top surface 109TS of the single-layered connecting structure 109. In some embodiments, the width W1 of the multi-layered connecting structure 200 may be less than or equal to the width W2 of the single-layered connecting structure 109. The depth D1 of the multi-layered connecting structure 200 may be equal to a depth D2 of the single-layered connecting structure 109.

With reference to FIG. 2, the multi-layered connecting structure 200 may include a plurality of first conductive layers 201-1, 201-3, 201-5 and a plurality of second conductive layers 203-1, 203-3, 203-5. The plurality of first conductive layers 201-1, 201-3, 201-5 and the plurality of second conductive layers 203-1, 203-3, 203-5 may be alternatively stacked. The sidewalls of the plurality of first conductive layers 201-1, 201-3, 201-5 and the sidewalls of the plurality of second conductive layers 203-1, 203-3, 203-5 together form sidewall 200S of the multi-layered connecting structure 200. The sidewalls of the multi-layered connecting structure 200 may be substantially vertical.

In some embodiments, the plurality of first conductive layers 201-1, 201-3, 201-5 and the plurality of second conductive layers 203-1, 203-3, 203-5 may have different stress states. For example, the plurality of first conductive layers 201-1, 201-3, 201-5 may have tensile stress and the plurality of second conductive layers 203-1, 203-3, 203-5 may have compressive stress, or vice versa. The plurality of first conductive layers 201-1, 201-3, 201-5 and the plurality of second conductive layers 203-1, 203-3, 203-5 may be formed including, for example, titanium, titanium nitride, ruthenium, molybdenum, chromium, vanadium, palladium, platinum, rhodium, scandium, aluminum, niobium, niobium nitride, tungsten, tungsten nitride, tantalum, tantalum nitride, or silicides thereof.

The stress states of the plurality of first conductive layers 201-1, 201-3, 201-5 and the plurality of second conductive layers 203-1, 203-3, 203-5 may be controlled by forming the plurality of first conductive layers 201-1, 201-3, 201-5 and the plurality of second conductive layers 203-1, 203-3, 203-5 with different materials. Specifically, the plurality of second conductive layers 203-1, 203-3, 203-5 are formed of a material having a higher stress state and the plurality of second conductive layers 203-1, 203-3, 203-5 are formed a material having a lower stress state. The plurality of second conductive layers 203-1, 203-3, 203-5 having lower stress state may have thicker thicknesses than the plurality of first conductive layers 201-1, 201-3, 201-5 having higher stress state to compensate for the stress of the plurality of first conductive layers 201-1, 201-3, 201-5 having higher stress state. Specifically, the plurality of first conductive layers 201-1, 201-3, 201-5 may have thicknesses between about 5 nm and 50 nm. The plurality of second conductive layers 203-1, 203-3, 203-5 may have thicknesses between about 10 nm and about 150 nm.

In some embodiments, the plurality of first conductive layers 201-1, 201-3, 201-5 may be large grain layers and the plurality of second conductive layers 203-1, 203-3, 203-5 may be buffer layers. The large grain layers and the buffer layers may be formed including, for example, titanium, titanium nitride, ruthenium, molybdenum, chromium, vanadium, palladium, platinum, rhodium, scandium, aluminum, niobium, niobium nitride, tungsten, tungsten nitride, tantalum, tantalum nitride, tantalum oxide, or silicides thereof. For example, the large grain layers may be formed of a pure metal (e.g., tantalum) and the buffer layers may be formed of the metal nitride (e.g., tantalum nitride) or metal oxide (e.g., tantalum oxide) versions of the pure metal. The large grain layers may have thicknesses between about 10 nm and about 30 nm. The buffer layers may have thicknesses between about 1 nm and about 5 nm. The buffer layers may block crystal structures of underlying large grain layers from extending upward in the direction Z to prevent the propagation of grain structure through the multi-layered connecting structure 200. As a result, the stress of the multi-layered connecting structure 200 may be reduced. Hence, the wafer bowing may be reduced or avoided.

Figure 3:
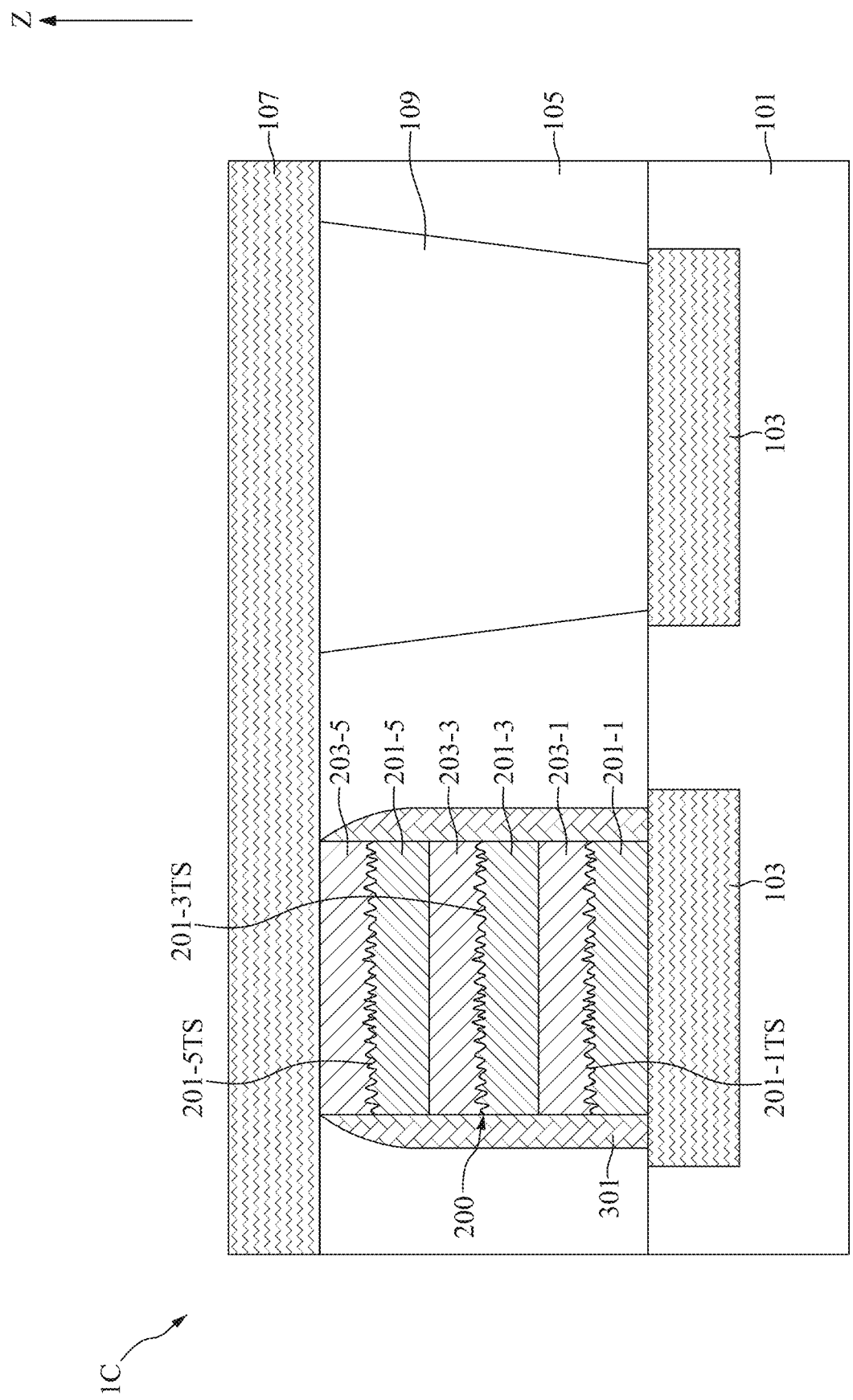

With reference to FIG. 3, the semiconductor device 1C may have a structure similar to that illustrated in FIG. 2. The same or similar elements in FIG. 3 as in FIG. 2 have been marked with similar reference numbers and duplicative descriptions have been omitted.

With reference to FIG. 3, the plurality of first conductive layers 201-1, 201-3, 201-5 may have rough top surfaces 201-1TS, 201-3TS, 201-5TS. The plurality of second conductive layers 203-1, 203-3, 203-5 may reduce the roughness by filling in gaps at the top surfaces 201-1TS, 201-3TS, 201-5TS of the plurality of first conductive layers 201-1, 201-3, 201-5. The roughness of the plurality of first conductive layers 201-1, 201-3, 201-5 may depend on the materials used and the deposition process, some materials and some deposition processes producing rougher top surfaces than other materials and deposition processes. For example, depending on plasma density, nitrogen content, or other factors, metals having high melting point or metal nitrides may produce a structure with a rough top surface.

Figure 4:
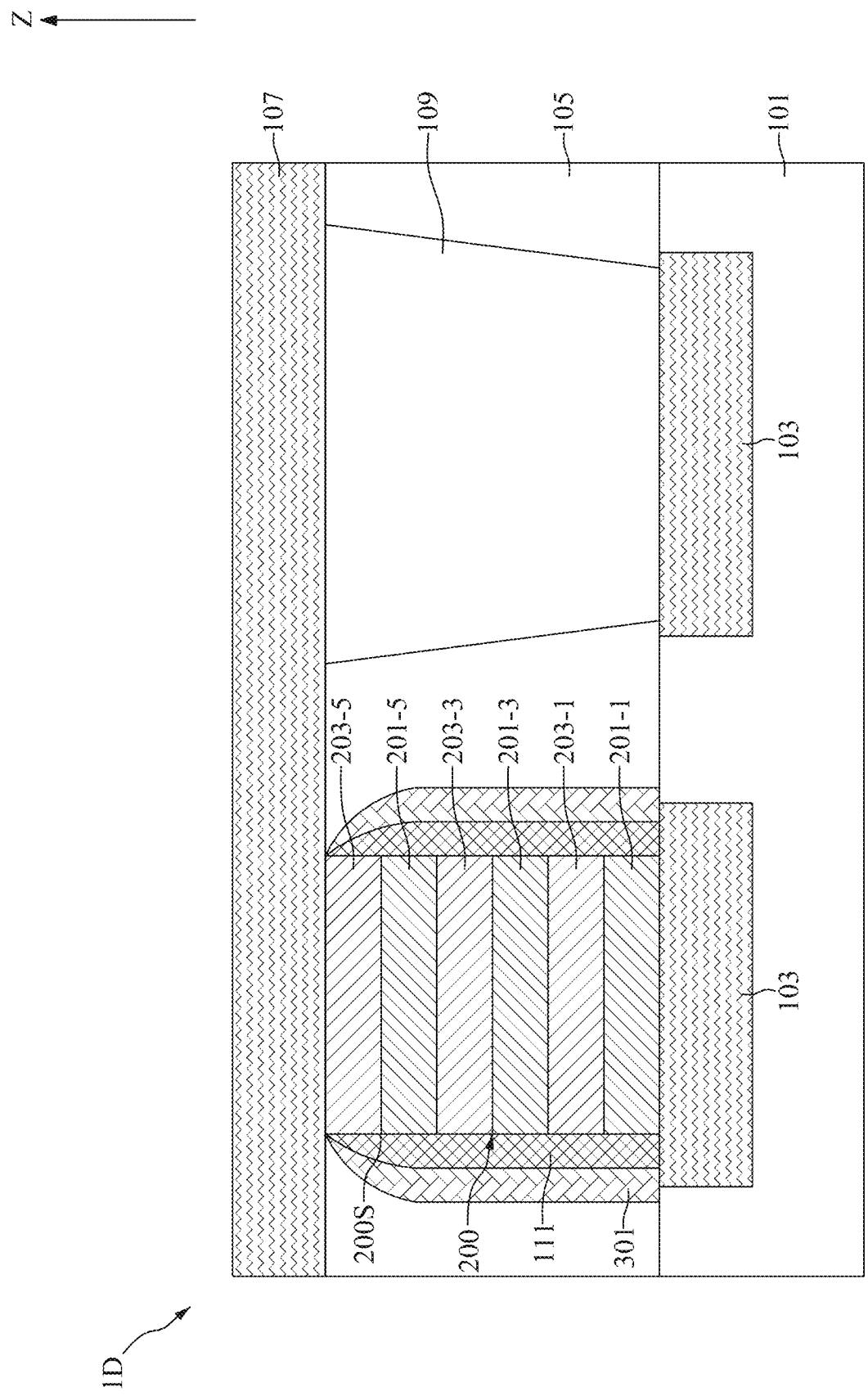

With reference to FIG. 4, the semiconductor device 1D may have a structure similar to that illustrated in FIG. 2. The same or similar elements in FIG. 4 as in FIG. 2 have been marked with similar reference numbers and duplicative descriptions have been omitted.

With reference to FIG. 4, the porous spacers 111 may be disposed on the sidewalls 200S of the multi-layered connecting structure 200. The first spacers 301 may be disposed on the sidewalls of the porous spacers 111. In some embodiments, the first spacers 301 may be optional.

The porous spacers 111 may be formed from an energy-removable material. The porous spacers 111 may include a skeleton and a plurality of empty spaces disposed among the skeleton. The plurality of empty spaces may be connected to each other and may be filled with air. The skeleton may include, for example, silicon oxide, low-dielectric materials, or methyl silsesquioxane. The porous spacers 111 may have a porosity between about 10% and about 100%. It should be noted that, when the porosity is 100%, it means the porous spacers 111 includes only empty spaces and the porous spacers 111 may be regarded as air gaps. In some embodiments, the porosity of the porous spacers 111 may be between about 10% and about 90%, between about 45% and about 75%. The plurality of empty spaces of the porous spacers 111 may be filled with air. As a result, a dielectric constant of the porous spacers 111 may be significantly lower than a dielectric constant of spacers formed of, for example, only silicon oxide. Therefore, the porous spacers 111 may significantly reduce the parasitic capacitance between the multi-layered connecting structure 200 and the single-layered connecting structure 109. That is, the porous spacers 111 may significantly alleviate an interference effect between electrical signals induced in or applied to the semiconductor device 1D.

The energy-removable material may include a material such as a thermal-decomposable material, a photonic-decomposable material, an e-beam decomposable material, or a combination thereof. For example, the energy-removable material may include a base material and a decomposable porogen material that is sacrificially removed upon being exposed to an energy source.

Figure 5:
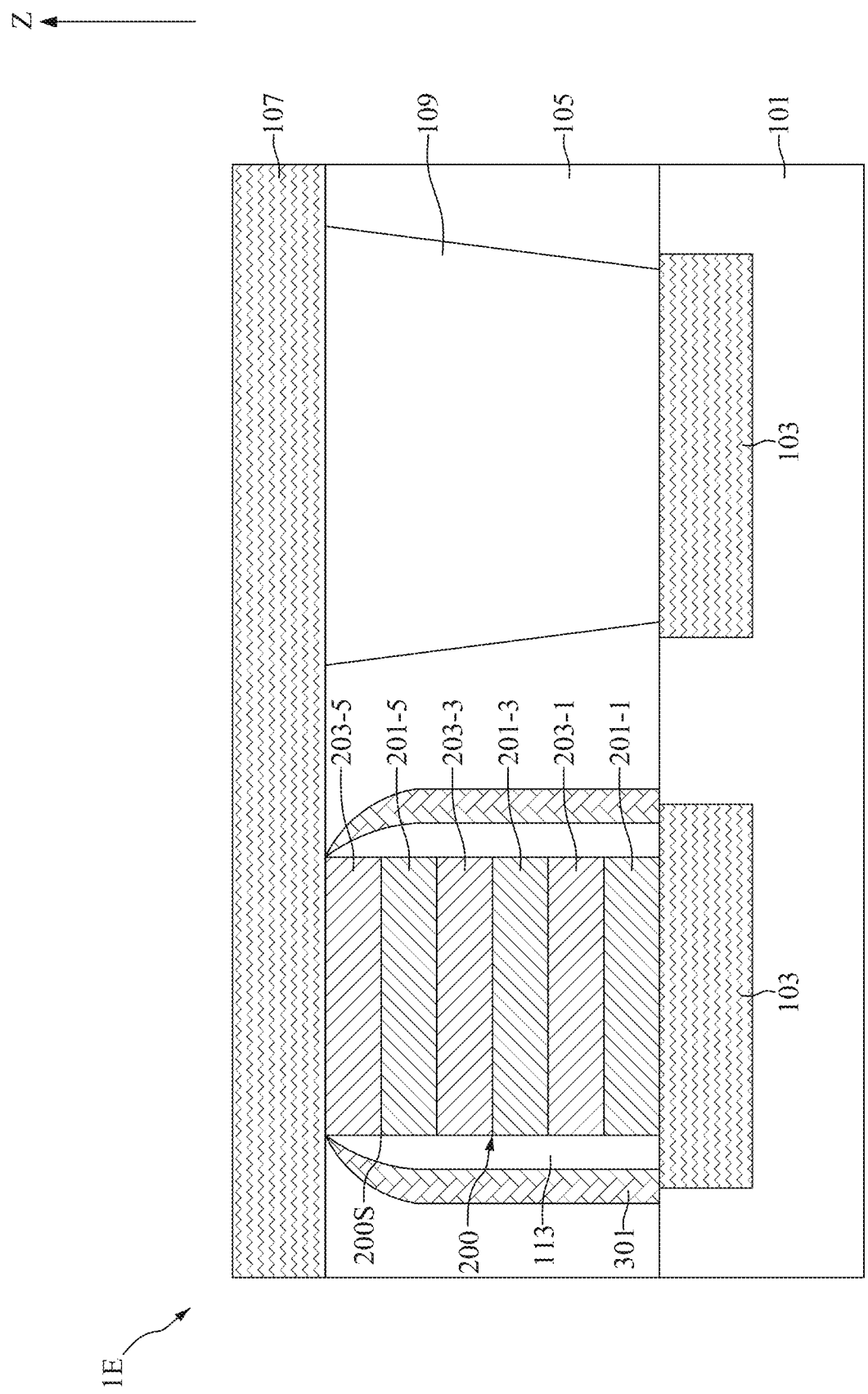

With reference to FIG. 5, the semiconductor device 1E may have a structure similar to that illustrated in FIG. 4. The same or similar elements in FIG. 5 as in FIG. 4 have been marked with similar reference numbers and duplicative descriptions have been omitted.

With reference to FIG. 5, air gaps 113 may be disposed between the sidewalls 200S of the multi-layered connecting structure 200 and the first spacers 301. The air gaps 113 may significantly reduce the parasitic capacitance between the multi-layered connecting structure 200 and the single-layered connecting structure 109. That is, the air gaps 113 may significantly alleviate an interference effect between electrical signals induced in or applied to the semiconductor device 1E.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 6:
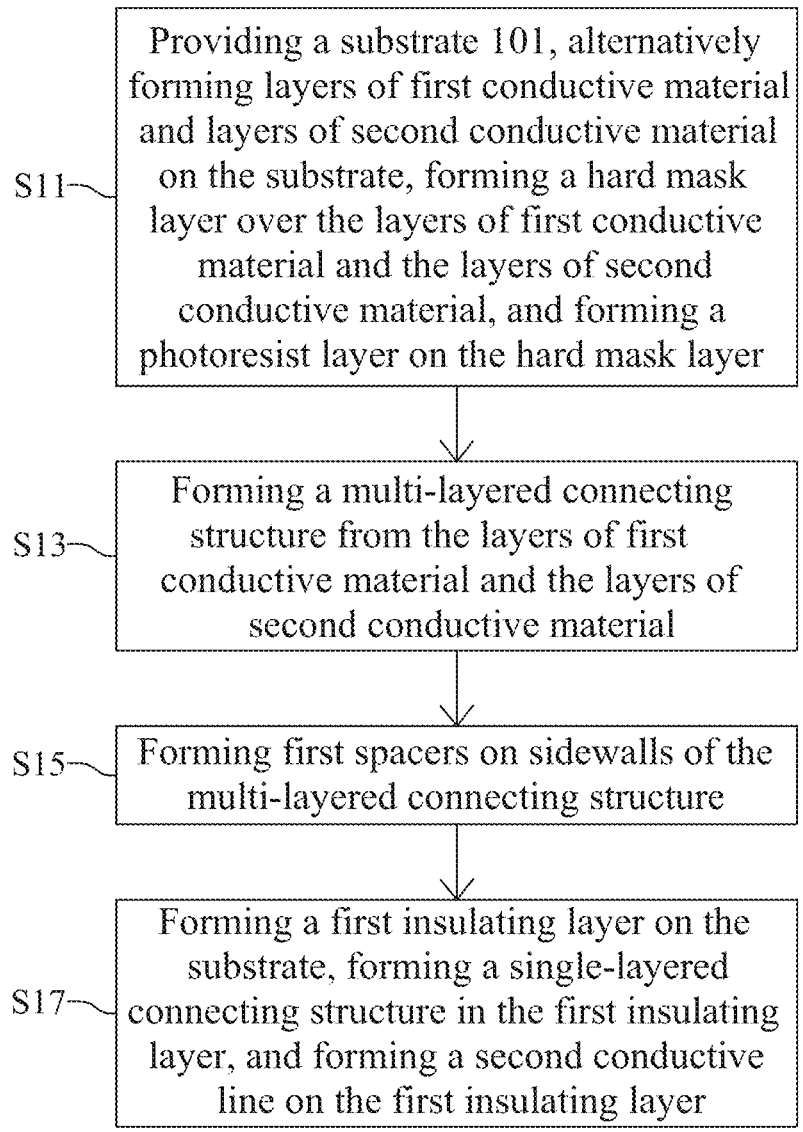
FIG. 6 illustrates, in a flowchart diagram form, a method for fabricating a semiconductor device in accordance with one embodiment of the present disclosure.

FIG. 6 illustrates, in a flowchart diagram form, a method 10 for fabricating a semiconductor device 1B in accordance with one embodiment of the present disclosure. FIGS. 7 to 14 illustrate, in schematic cross-sectional view diagrams, a flow for fabricating the semiconductor device 1B in accordance with one embodiment of the present disclosure.

Figure 7:
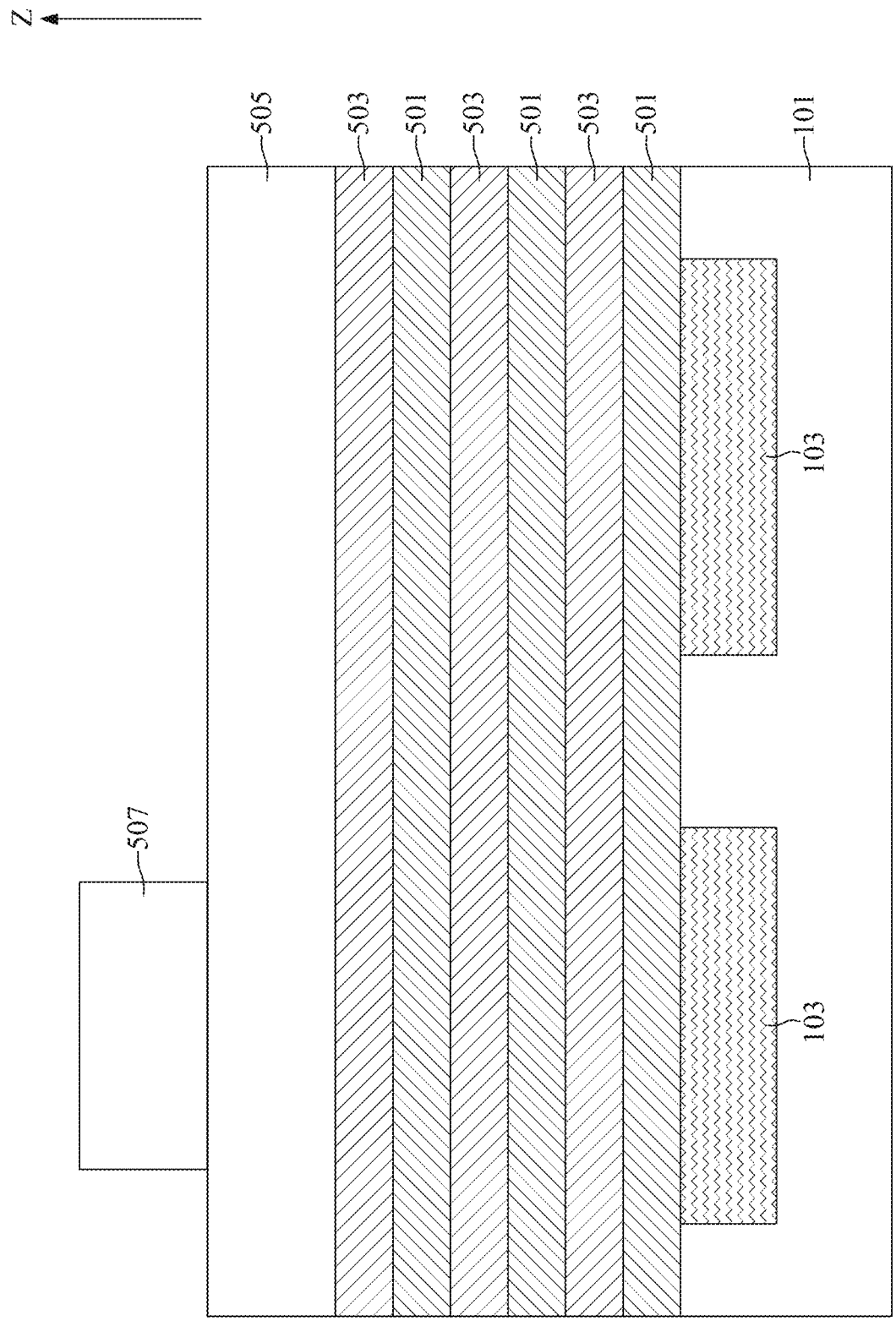
FIGS. 7 to 14 illustrate, in schematic cross-sectional view diagrams, a flow for fabricating the semiconductor device in accordance with one embodiment of the present disclosure.

With reference to FIGS. 6 and 7, at step S11, a substrate 101 may be provided, layers of first conductive material 501 and layers of second conductive material 503 may be alternatively formed on the substrate 101, a hard mask layer 505 may be formed over the layers of first conductive material 501 and the layers of second conductive material 503, and a photoresist layer 507 may be formed on the hard mask layer 505.

With reference to FIG. 7, the layers of first conductive material 501 and the layers of second conductive material 503 may be formed including, for example, titanium, titanium nitride, ruthenium, molybdenum, chromium, vanadium, palladium, platinum, rhodium, scandium, aluminum, niobium, niobium nitride, tungsten, tungsten nitride, tantalum, tantalum nitride, tantalum oxide, or silicides thereof. The layers of first conductive material 501 and the layers of second conductive material 503 may be formed by chemical vapor deposition, plasma-enhanced chemical vapor deposition, physical vapor deposition, ionized physical vapor deposition, atomic layer deposition, electroplating, or electroless plating, but are not limited thereto. It should be noted that the stacked structure of the layers of first conductive material 501 and the layers of second conductive material 503 may be also referred to as a stacked layers.

In some embodiments, the layers of first conductive material 501 and the layers of second conductive material 503 may have different stress states. For example, the layers of first conductive material 501 may have tensile stress and the layers of second conductive material 503 may have compressive stress, or vice versa. The stress states of the layers of first conductive material 501 and the layers of second conductive material 503 may be controlled by forming the layers of first conductive material 501 and the layers of second conductive material 503 with different materials. Specifically, the layers of first conductive material 501 are formed of a material having a higher stress state and the layers of second conductive material 503 are formed a material having a lower stress state. The layers of second conductive material 503 having lower stress state may have a thicker thickness than the layers of first conductive material 501 having higher stress state to compensate for the stress of the layers of first conductive material 501 having higher stress state. Specifically, the layers of first conductive material 501 may have thicknesses between about 5 nm and 50 nm. The layers of second conductive material 503 may have thicknesses between about 10 nm and about 150 nm.

For another example, the stress states of the layers of first conductive material 501 and the layers of second conductive material 503 may be controlled by forming the layers of first conductive material 501 and the layers of second conductive material 503 as nitrides with different nitrogen levels. Specifically, the layers of first conductive material 501 may be formed of nitrides having higher nitrogen level so as to have a higher stress state due to a more disrupted crystallization. In contrast, the layers of second conductive material 503 may be formed of nitrides having lower nitrogen level so as to have a lower stress state. The different nitrogen levels of the layers of first conductive material 501 and the layers of second conductive material 503 may be controlled by the amount of the reactant during the deposition processes of the layers of first conductive material 501 and the layers of second conductive material 503. In this example, each of the layers of first conductive material 501 may have a same thickness as each of the layers of second conductive material 503 but is not limited thereto.

The layers of first conductive material 501 and the layers of second conductive material 503 that have different stress states may cancel the stress of the stacked layers or at least reduce to the stress of the stacked layers to a desired amount. Hence, the wafer bowing may be reduced or avoided.

In some embodiments, the layers of first conductive material 501 may be large grain layers and the layers of second conductive material 503 may be buffer layers. The large grain layers may have thicknesses between about 10 nm and about 30 nm. The buffer layers may have thicknesses between about 1 nm and about 5 nm. The buffer layers may block crystal structures of underlying large grain layers from extending upward in the direction Z to prevent the propagation of grain structure through the stacked layers. As a result, the stress of the stacked layers may be reduced. Hence, the wafer bowing may be reduced or avoided.

With reference to FIG. 7, the hard mask layer 505 may be formed of, for example, silicon oxide, silicon nitride, silicon oxynitride, or silicon nitride oxide. A photolithography process may be performed to transfer desired pattern to the photoresist layer 507 and define a pattern of a multi-layered connecting structure 200.

Figure 8:
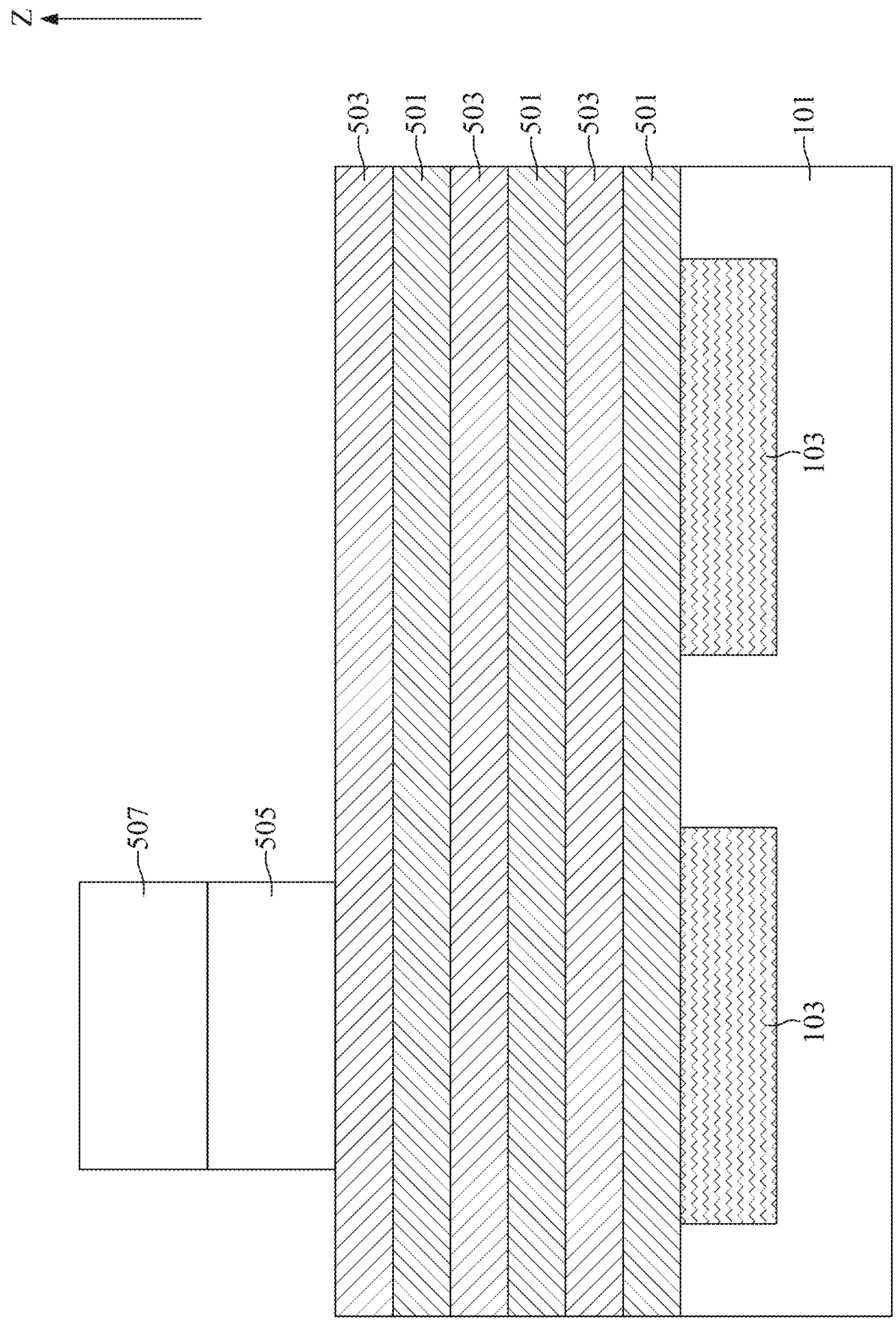
Figure 9:
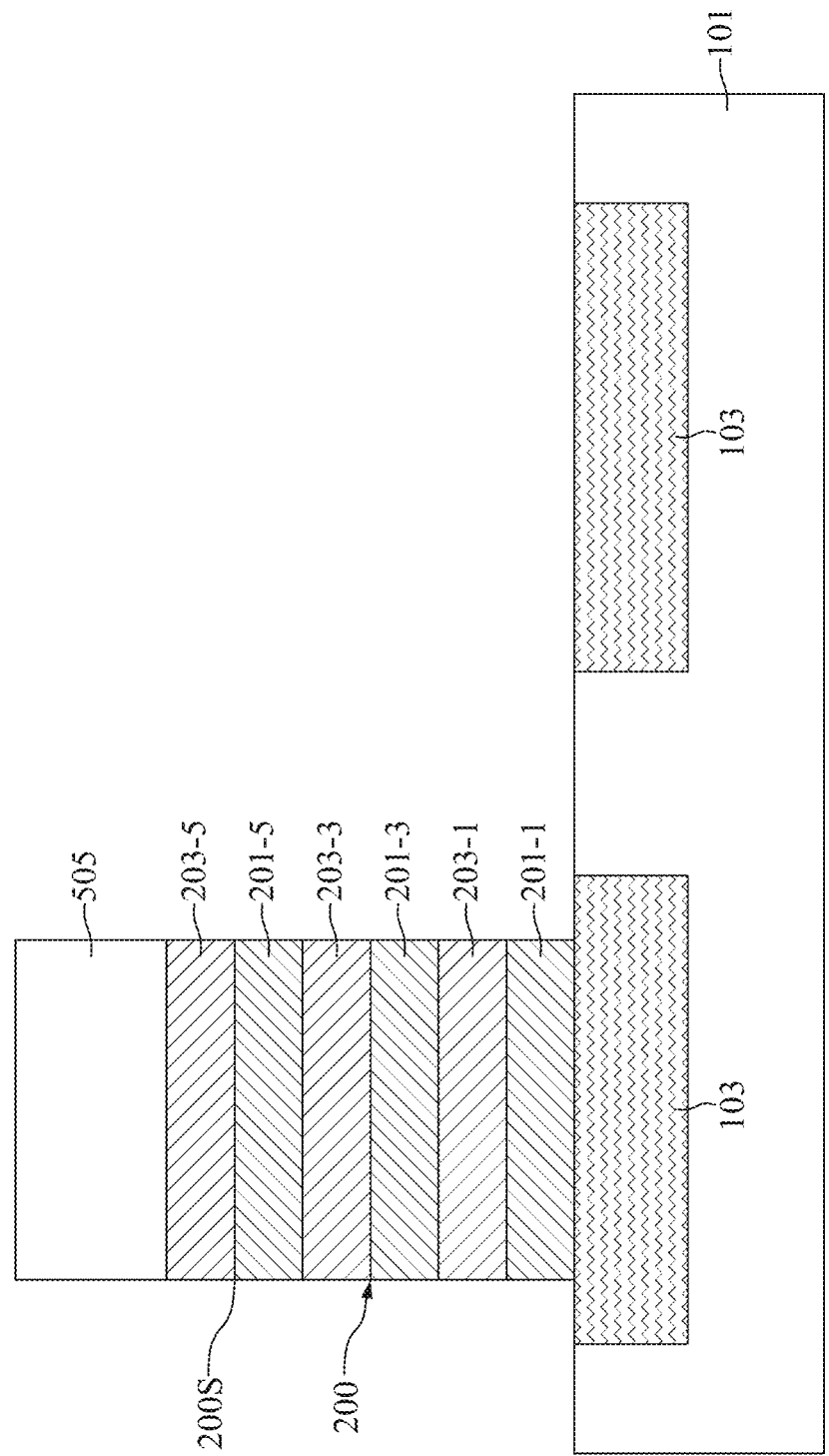

With reference to FIGS. 6, 8, and 9, at step S13, the multi-layered connecting structure 200 may be formed from the layers of first conductive material 501 and the layers of second conductive material 503.

With reference to FIG. 8, an etch process may be performed to remove the exposed portion of the hard mask layer 505 so as to transfer the pattern of the multi-layered connecting structure 200 onto the hard mask layer 505. After the etch process, the photoresist layer 507 may be removed.

With reference to FIG. 9, an etch process may be subsequently performed to remove the exposed portions of the layers of first conductive material 501 and the layers of second conductive material 503. Depending on the etch selectivity of the layers of first conductive material 501 and the layers of second conductive material 503 with respect to each other, the etch process may be done either with the same chemistry to remove both the layers of first conductive material 501 and the layers of second conductive material 503, or cycled between processes tailored to each respective material of the layers of first conductive material 501 and the layers of second conductive material 503. For example, a fluorine-based etch may be used for removal of the exposed portions of the layers of first conductive material 501, and a chlorine-based etch may be used for removal of the exposed portions of the layers of second conductive material 503.

With reference to FIG. 9, after the etch process, the layers of first conductive material 501 may be turned into the plurality of first conductive layers 201-1, 201-3, 201-5, and the layers of second conductive material 503 may be turned into the plurality of second conductive layers 203-1, 203-3, 203-5. The plurality of first conductive layers 201-1, 201-3, 201-5 and the plurality of second conductive layers 203-1, 203-3, 203-5 together form the multi-layered connecting structure 200. The hard mask layer 505 may be removed after the formation of the multi-layered connecting structure 200.

Figure 10:
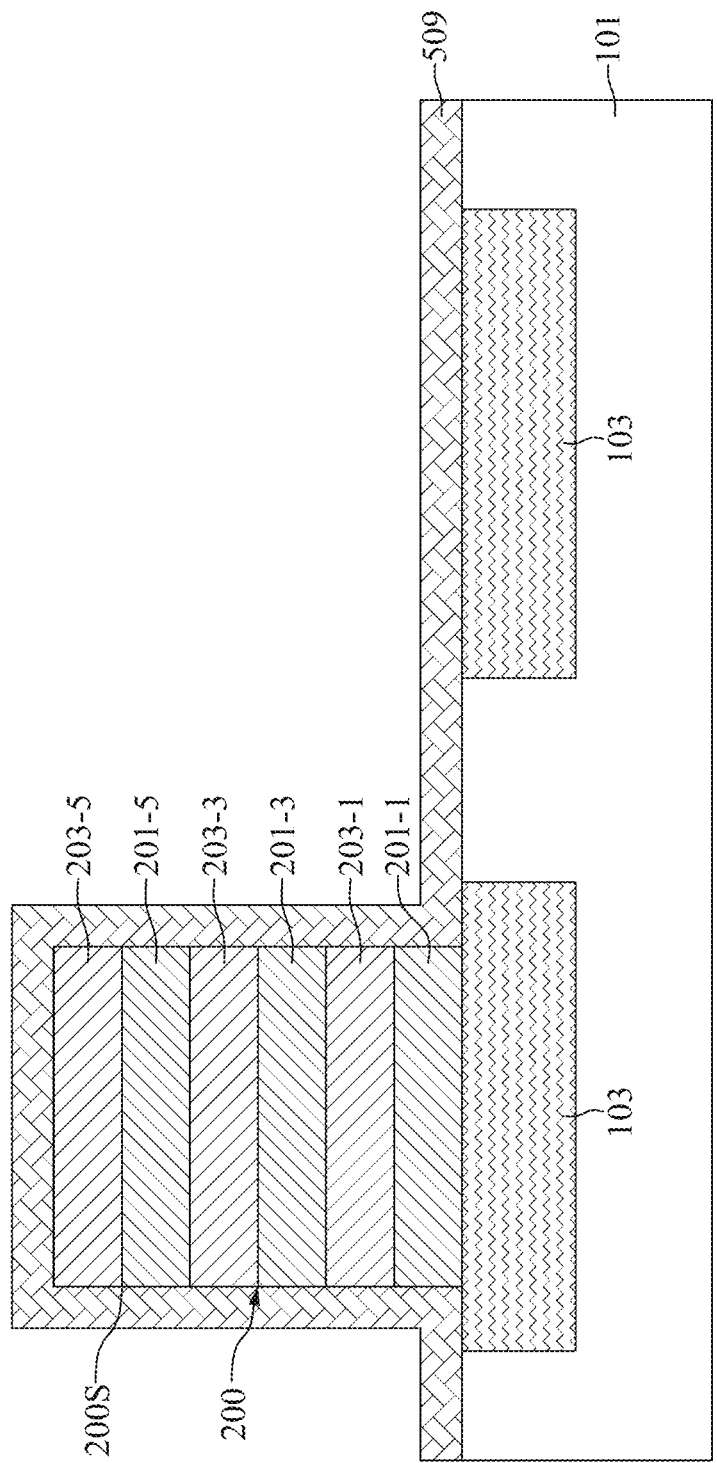
Figure 11:
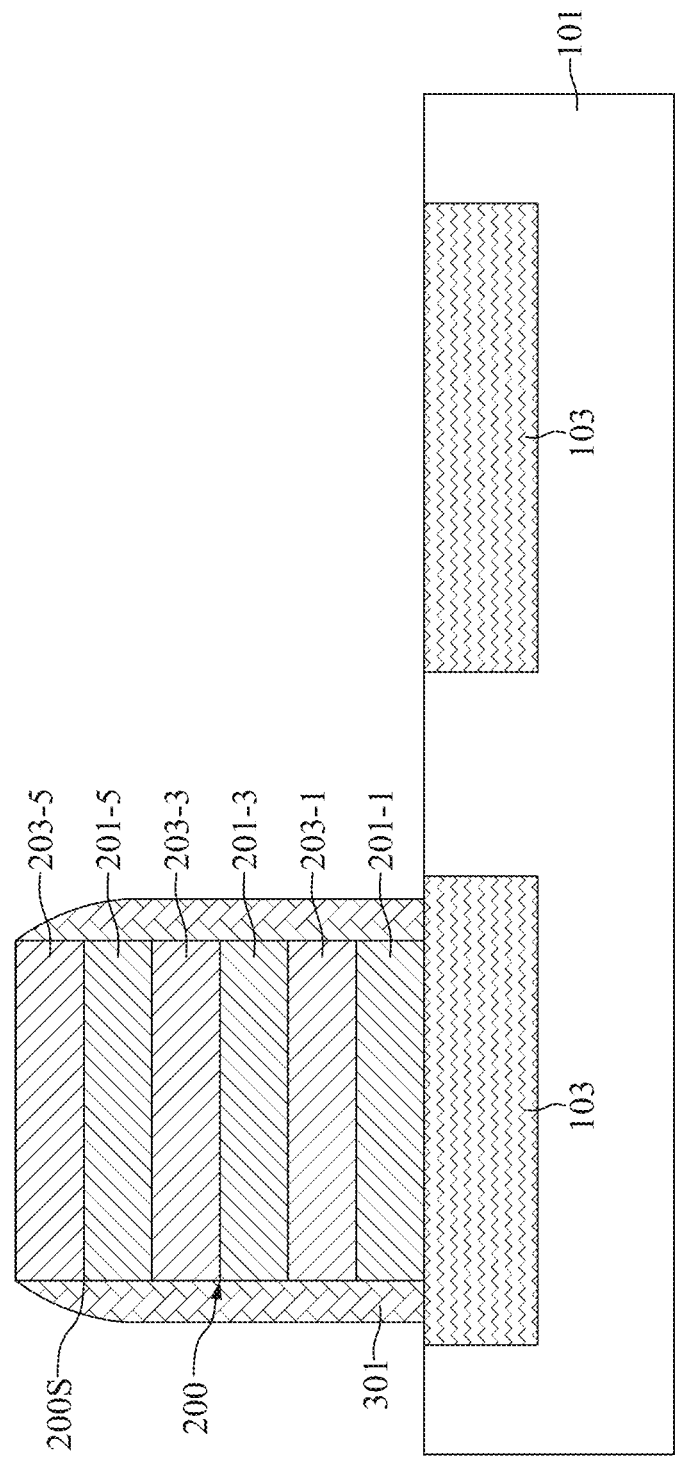

With reference to FIGS. 6, 10, and 11, at step S15, first spacers 301 may be formed on sidewalls 200S of the multi-layered connecting structure 200.

With reference to FIG. 10, a layer of spacer material 509 may be formed to cover the top surface of the substrate 101, the sidewalls of the multi-layered connecting structure 200, and the top surface of the multi-layered connecting structure 200. The spacer material 509 may be, for example, silicon oxide, silicon nitride, silicon carbon nitride, silicon nitride oxide, or silicon oxynitride.

With reference to FIG. 11, an anisotropic etch process may be performed to remove the layer of spacer material 509 formed on the top surface of the substrate 101 and top surface of the multi-layered connecting structure 200. After the anisotropic etch process, the layer of spacer material 509 may be turned into the first spacers 301 on the sidewalls of the multi-layered connecting structure 200.

With reference to FIG. 6 and FIGS. 12 to 14, at step S17, a first insulating layer 105 may be formed on the substrate 101, a single-layered connecting structure 109 may be formed in the first insulating layer 105, and a second conductive line 107 may be formed on the first insulating layer 105.

Figure 12:
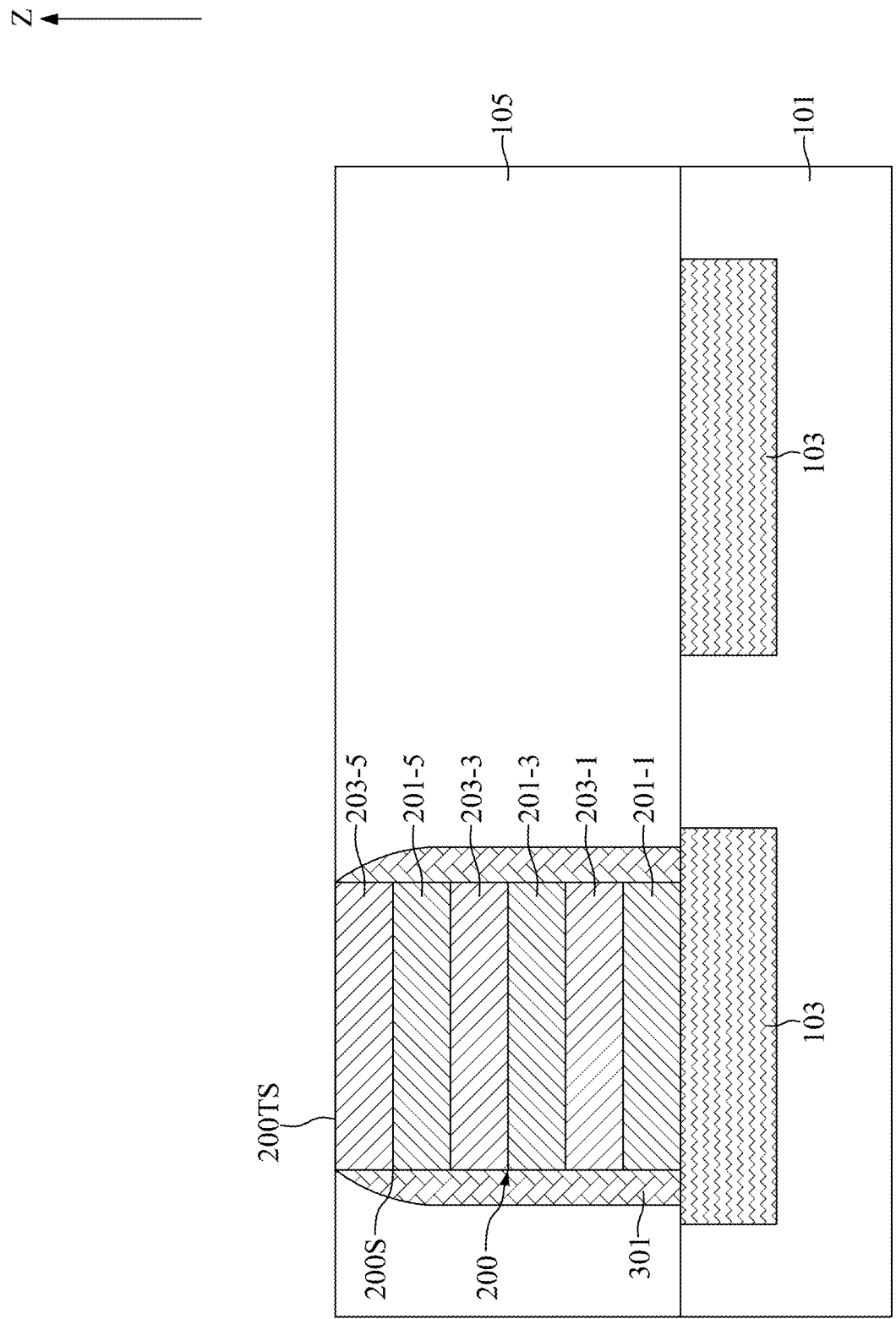

With reference to FIG. 12, the first insulating layer 105 may be formed on the substrate 101. The first insulating layer 105 may cover the multi-layered connecting structure 200 and the first spacers 301. A planarization process, such as chemical mechanical polishing, may be performed until the top surface 200TS of the multi-layered connecting structure 200 is exposed to remove excess material and provide a substantially flat surface for subsequent processing steps.

Figure 13:
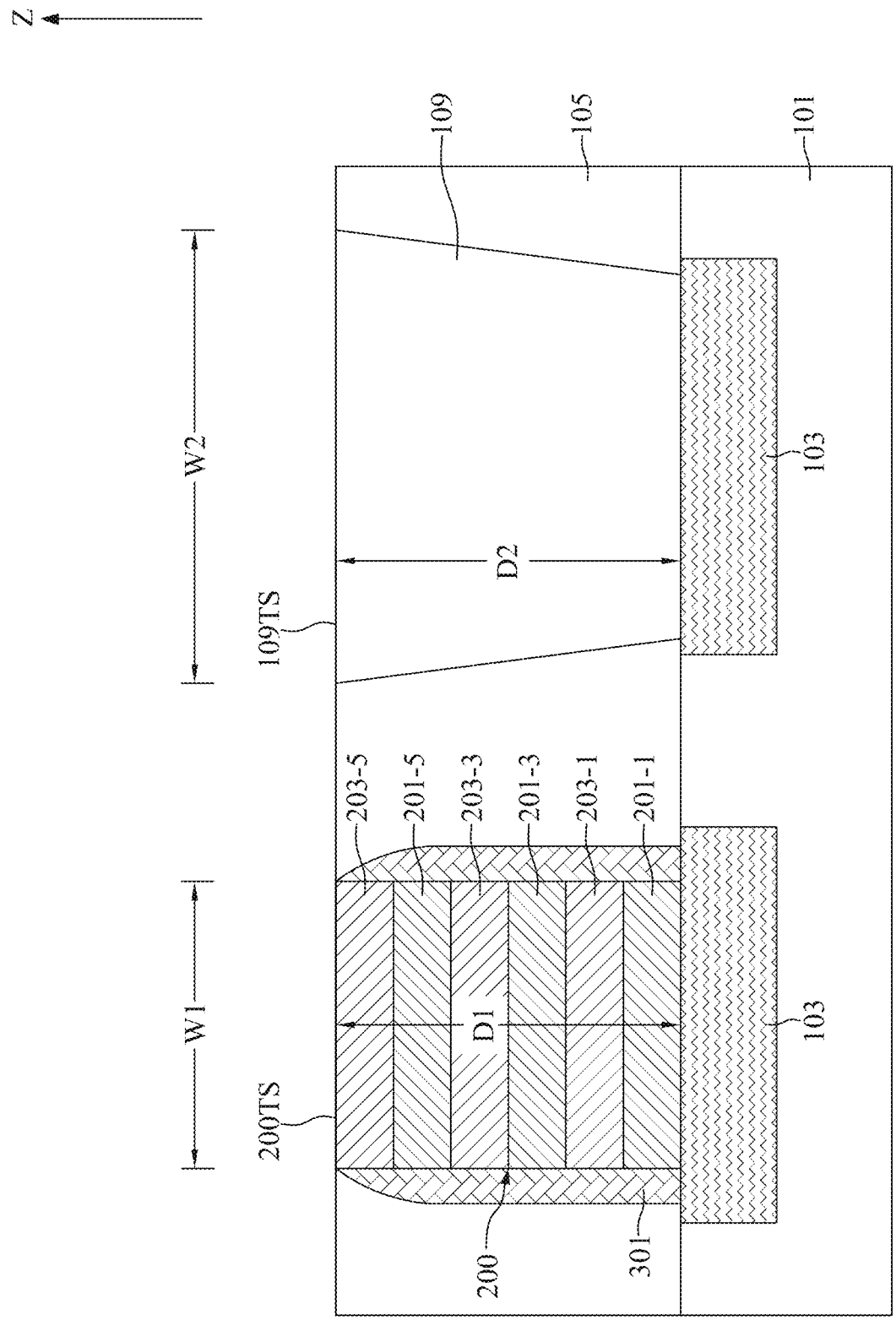

With reference to FIG. 13, the single-layered connecting structure 109 may be formed in the first insulating layer 105 by, for example, a damascene process. Due to the single-layered connecting structure 109 is formed by damascene process including an opening filling process, the single-layered connecting structure 109 may have a greater size and tapered sidewalls with respect to the multi-layered connecting structure 200 to avoid void formation during the opening filling process. Specifically, the width W2 of the single-layered connecting structure 109 may be greater than the width W1 of the multi-layered connecting structure 200. In contrast, the multi-layered connecting structure 200 formed by depositing multi-layers and removing undesired portions may complete avoid the void formation problems and may be more suitable for semiconductor device having smaller technical nodes such as 20 m, 14 nm, 7 nm, or below.

Figure 14:
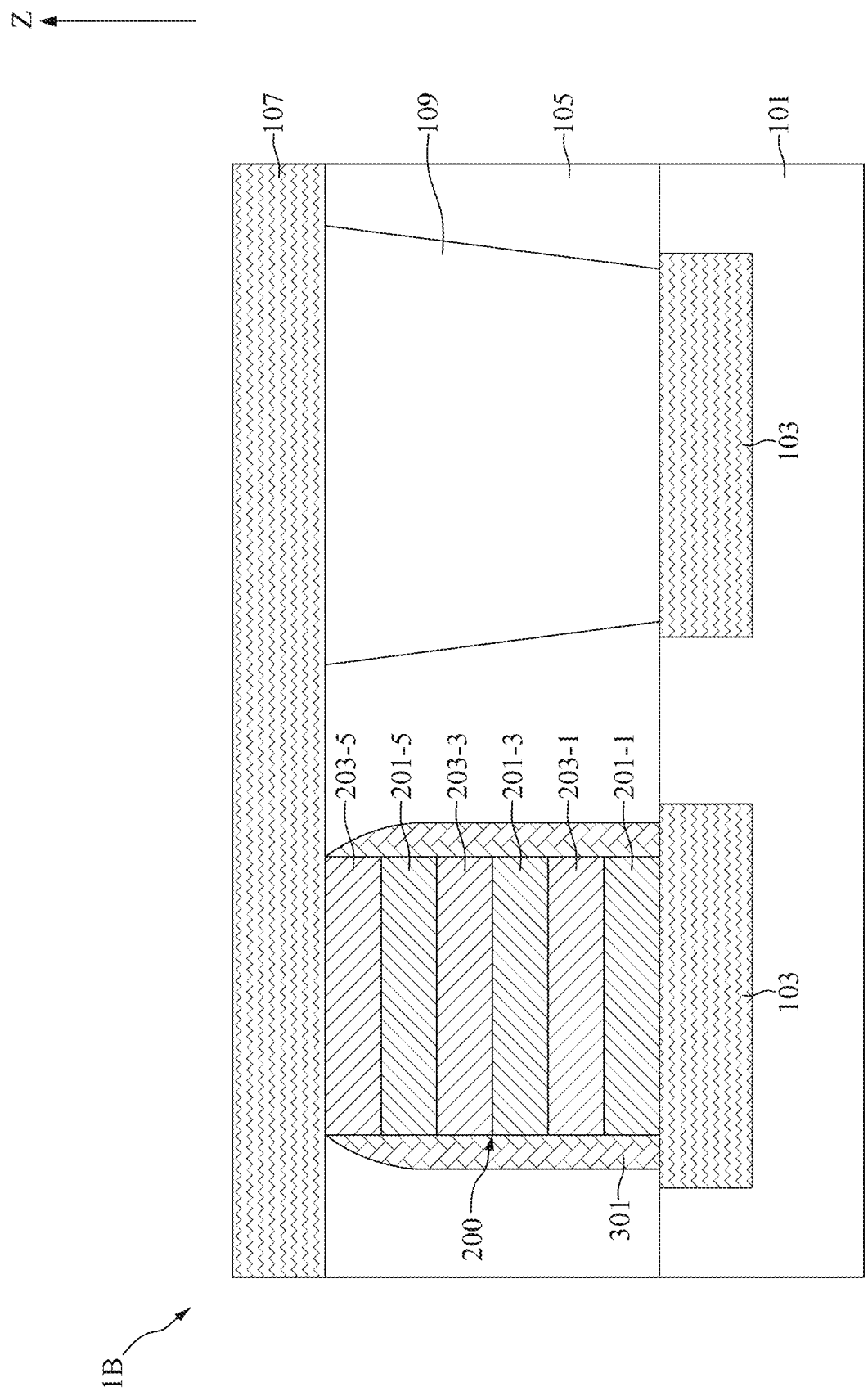

With reference to FIG. 14, the second conductive line 107 may be formed on the first insulating layer 105. The second conductive line 107 may electrically connected to the multi-layered connecting structure 200 and the single-layered connecting structure 109.

FIGS. 15 to 20 illustrate, in schematic cross-sectional view diagrams, a flow for fabricating a semiconductor device 1D in accordance with another embodiment of the present disclosure.

Figure 15:
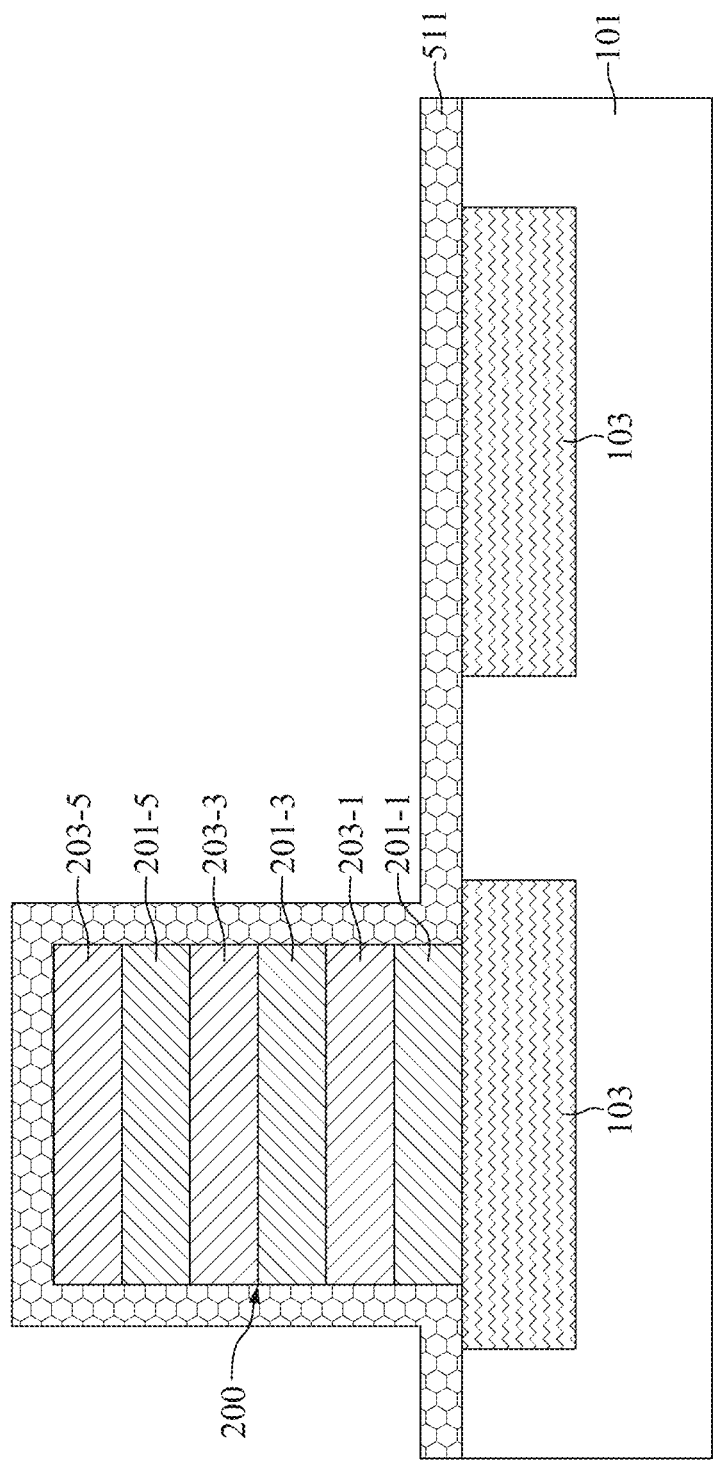
FIGS. 15 to 20 illustrate, in schematic cross-sectional view diagrams, a flow for fabricating a semiconductor device in accordance with another embodiment of the present disclosure.

With reference to FIG. 15, an intermediate semiconductor device may be fabricating with a procedure similar to that illustrated in FIGS. 7 to 9. A layer of energy-removable material 511 may be formed to cover the top surface of the substrate 101, the sidewalls of the multi-layered connecting structure 200, and the top surface of the multi-layered connecting structure 200. The energy-removable material 511 may include a material such as a thermal decomposable material, a photonic decomposable material, an e-beam decomposable material, or a combination thereof. For example, the energy-removable material 511 may include a base material and a decomposable porogen material that is sacrificially removed upon exposure to an energy source.

In some embodiments, the base material may include a methylsilsesquioxane based material. The decomposable porogen material may include a porogen organic compound that provides porosity to the base material of the energy-removable material.

In some embodiments, the base material may be silicon oxide. The decomposable porogen material may include compounds including unsaturated bonds such as double bonds or triple bonds. During exposure to an energy source, the unsaturated bonds of the decomposable porogen material may cross-link with silicon oxide of the base material. As a result, the decomposable porogen material may shrink and generate empty spaces, with the base material remaining in place. The empty spaces may be filled with air so that a dielectric constant of the empty spaces may be significantly low. In some embodiments, the base material may be low-k dielectric materials.

In some embodiments, the energy-removable material 511 may include a relatively high concentration of the decomposable porogen material and a relatively low concentration of the base material but is not limited thereto. For example, the energy-removable material 511 may include about 90% or greater of the decomposable porogen material, and about 10% or less of the base material. In another example, the energy-removable material 511 may include about 55% or greater of the decomposable porogen material, and about 45% or less of the base material. In another example, the energy-removable material 511 may include about 25% or greater of the decomposable porogen material, and about 75% or less of the base material. In another example, the energy-removable material 511 may include about 100% of the decomposable porogen material, and no base material is used.

Figure 16:
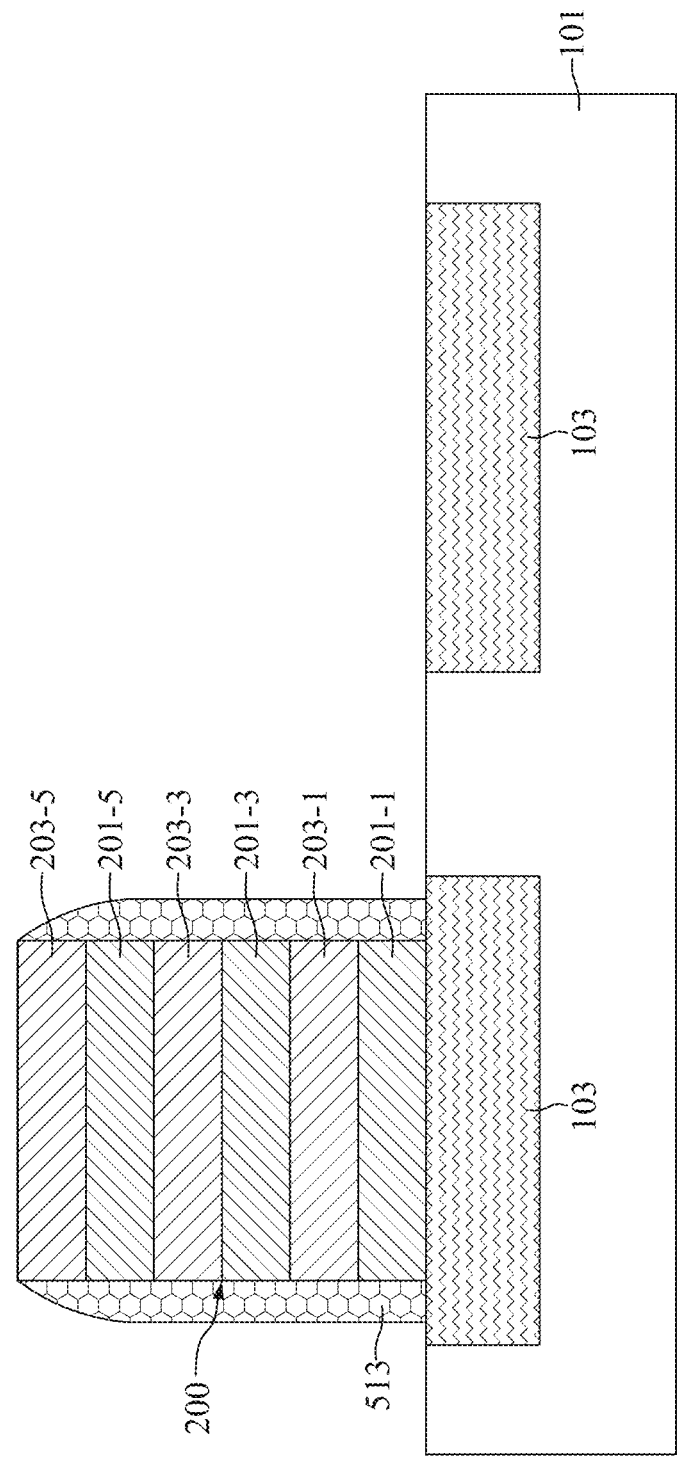

With reference to FIG. 16, an anisotropic etch process may be performed to remove the layer of energy-removable material 511 formed on the top surface of the substrate 101 and top surface of the multi-layered connecting structure 200. After the anisotropic etch process, the layer of energy-removable material 511 may be turned into sacrificial spacers 513 on the sidewalls of the multi-layered connecting structure 200.

Figure 17:
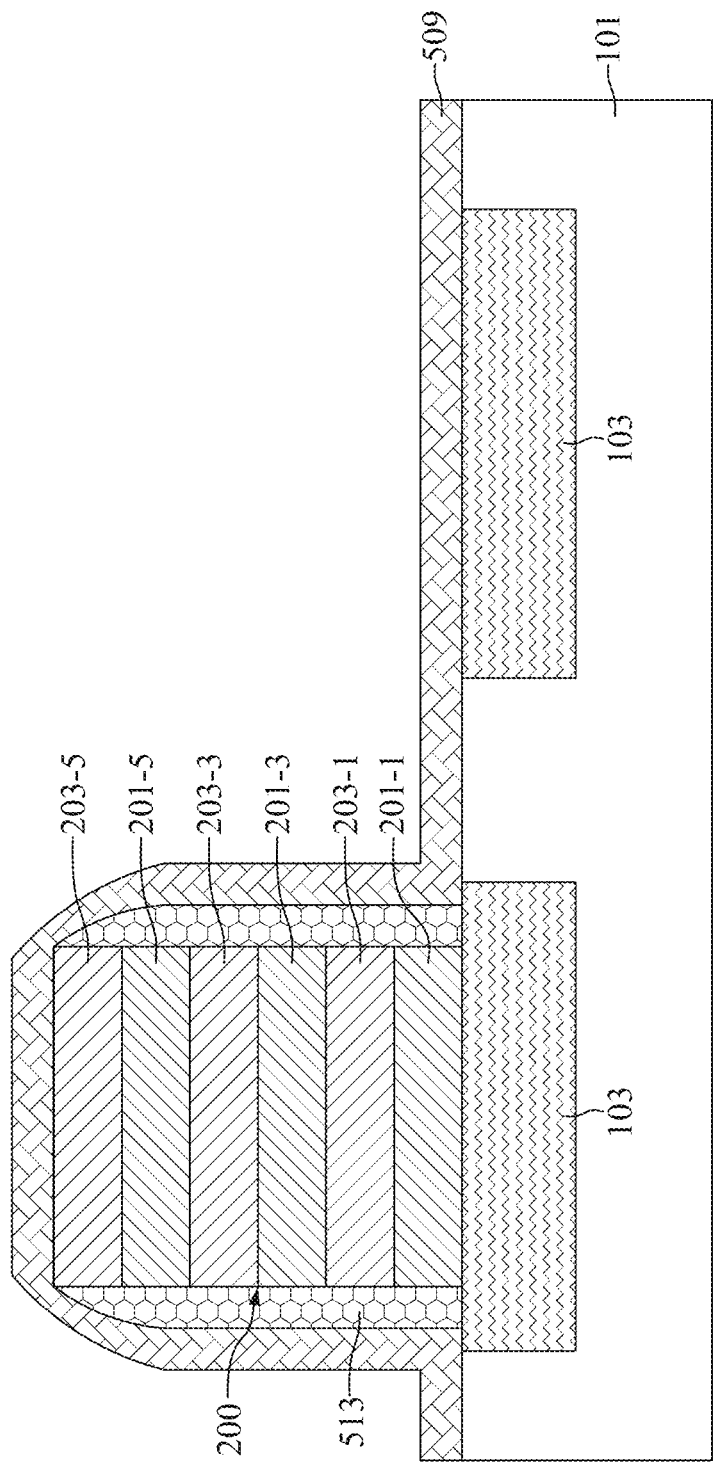

With reference to FIG. 17, a layer of spacer material 509 may be formed to cover the top surface of the substrate 101, the top surface 200TS of the multi-layered connecting structure 200, and sidewalls of the sacrificial spacers 513.

Figure 18:
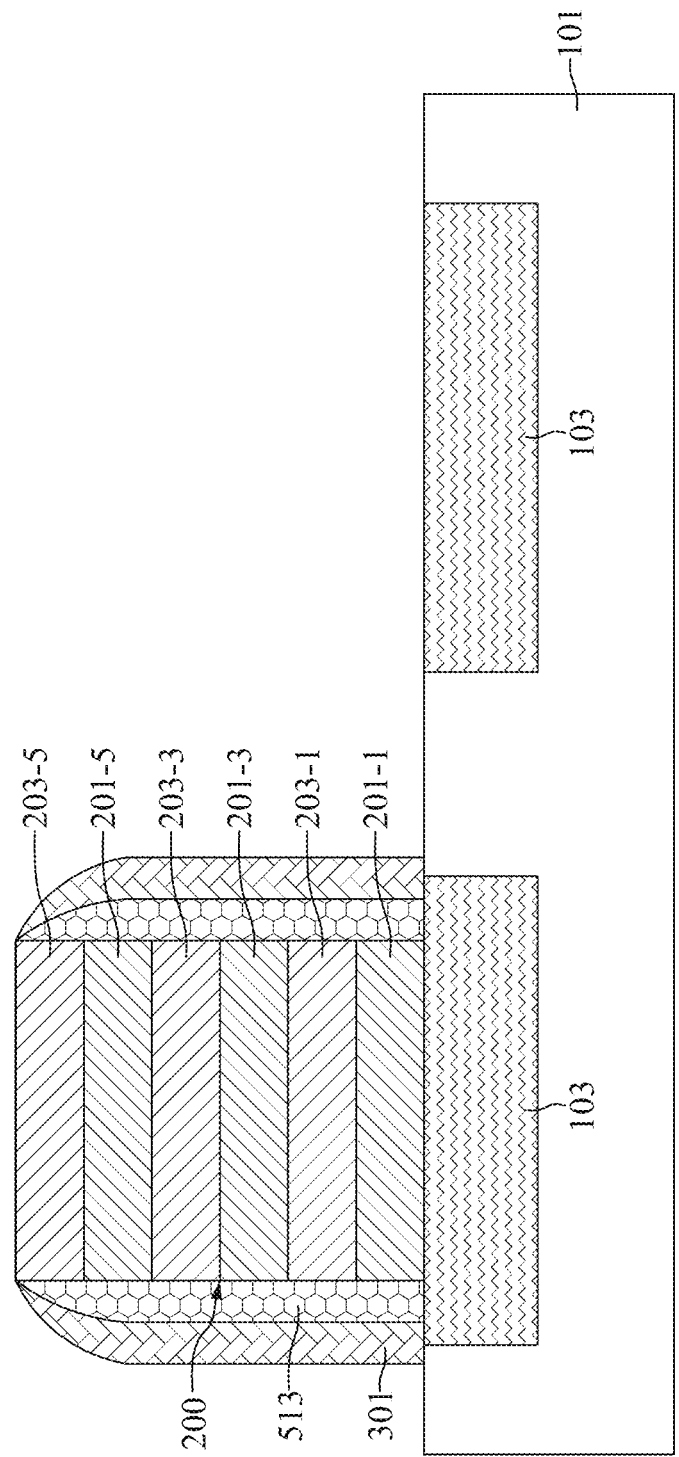

With reference to FIG. 18, an anisotropic etch process may be performed to remove the layer of spacer material 509 formed on the top surface of the substrate 101 and top surface of the multi-layered connecting structure 200. After the anisotropic etch process, the layer of spacer material 509 may be turned into sacrificial spacers 513 on the sidewalls of the sacrificial spacers 513.

Figure 19:
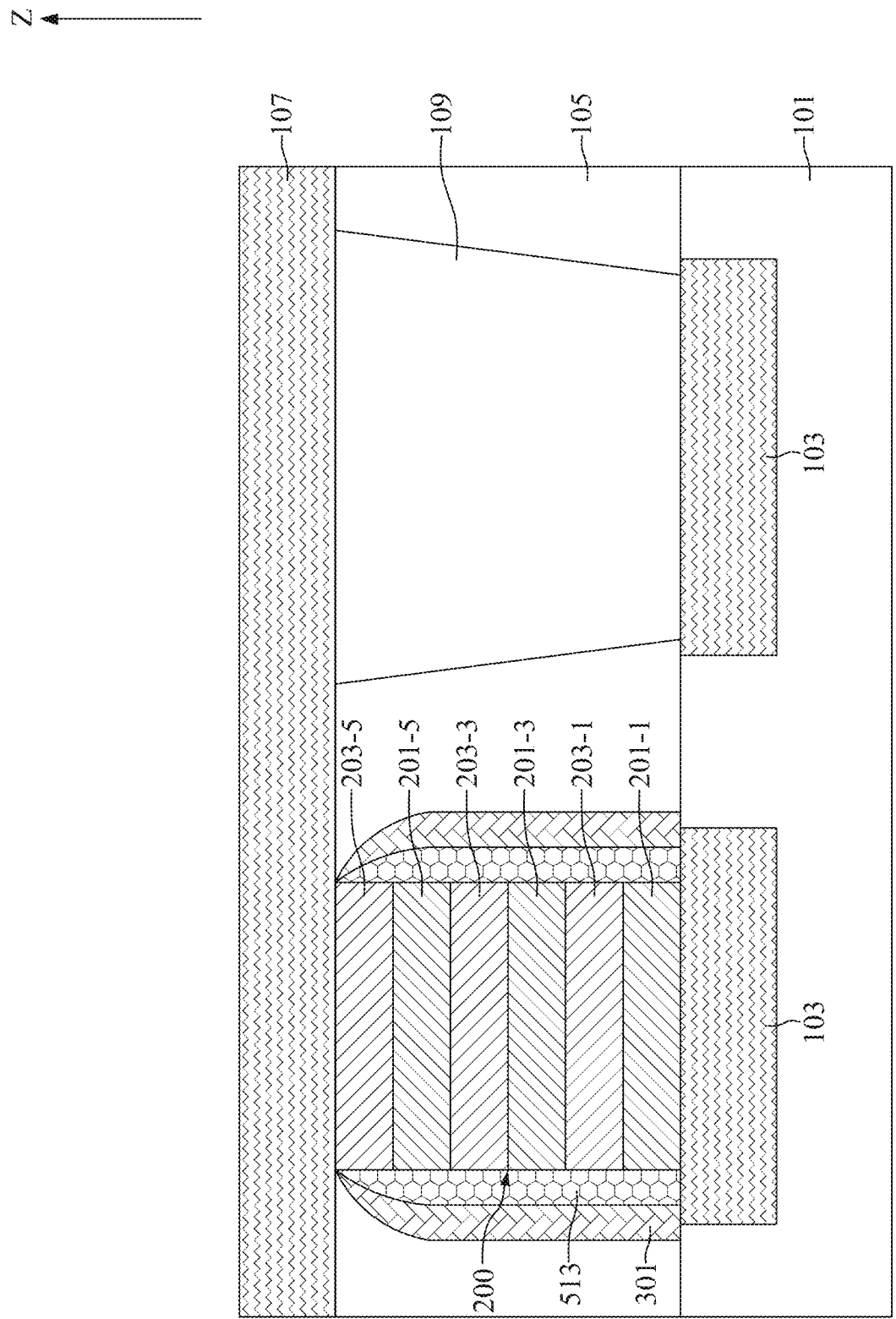

With reference to FIG. 19, the single-layered connecting structure 109 and the second conductive line 107 may be formed with a procedure similar to that illustrated in FIGS. 13 and 14.

Figure 20:
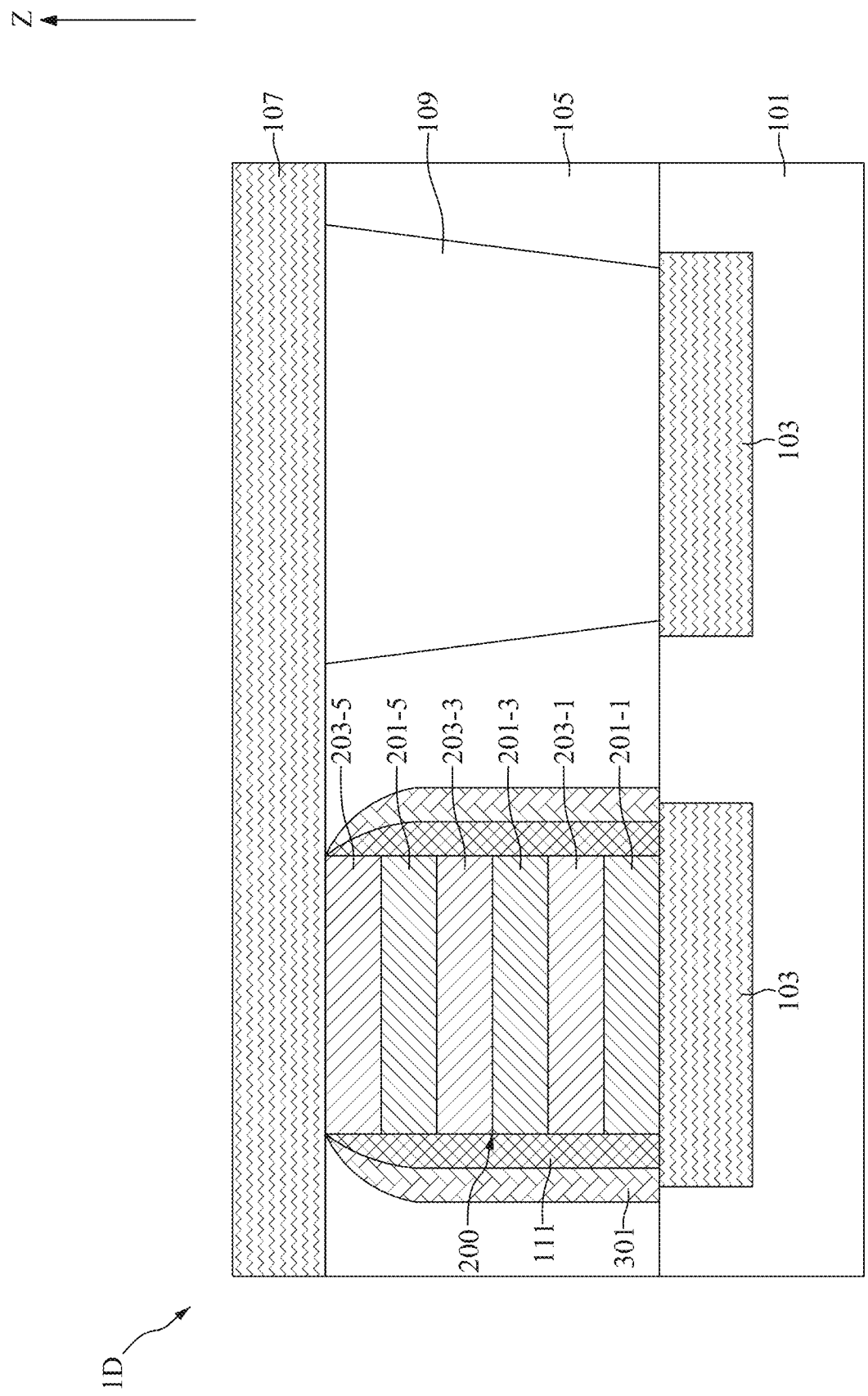

With reference to FIG. 20, an energy treatment may be performed to the intermediate semiconductor device in FIG. 17 by applying the energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place. After the energy treatment, the sacrificial spacers 513 may turn into porous spacers 111. The base material may turn into a skeleton of the porous spacers 111 and the empty spaces may be distributed among the skeleton of the porous spacers 111. In some embodiments, the energy treatment may be performed right after the formation of the first spacers 301.

One aspect of the present disclosure provides a semiconductor device including a substrate, a single-layered connecting structure positioned above the substrate, and a multi-layered connecting structure including a first conductive layer positioned above the substrate and a second conductive layer positioned on the first conductive layer. A top surface of the multi-layered connecting structure is substantially coplanar with a top surface of the single-layered connecting structure and a width of the multi-layered connecting structure is less than a width of the single-layered connecting structure.

Another aspect of the present disclosure provides a semiconductor device including a substrate, a single-layered connecting structure positioned above the substrate, and a multi-layered connecting structure positioned above the substrate and including a plurality of first conductive layers and a plurality of second conductive layers alternatively stacked. A top surface of the multi-layered connecting structure is substantially coplanar with a top surface of the single-layered connecting structure and a width of the multi-layered connecting structure is less than a width of the single-layered connecting structure.

Another aspect of the present disclosure provides a method for fabricating a semiconductor device including providing a substrate, forming a multi-layered connecting structure above the substrate and including a plurality of first conductive layers alternatively formed with a plurality of second conductive layers, and forming a single-layered connecting structure above the substrate and having a top surface of the single-layered connecting structure substantially coplanar with a top surface of the multi-layered connecting structure and a width of the single-layered connecting structure greater than a width of the multi-layered connecting structure.

Due to the design of the semiconductor device of the present disclosure, the multi-layered structure of the multi-layered connecting structure 200 may prevent the formation of voids and may be suitable for fabrication of semiconductor devices having small technical nodes. In addition, the porous spacers 111 or the air gaps 113 may reduce the parasitic capacitance of the semiconductor device 1D/1E.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   a single-layered connecting structure positioned above the substrate; and
   a multi-layered connecting structure positioned above the substrate and comprising a plurality of first conductive layers and a plurality of second conductive layers alternatively stacked;
   wherein a top surface of the multi-layered connecting structure is coplanar with a top surface of the single-layered connecting structure and a width of the multi-layered connecting structure is less than a width of the single-layered connecting structures;
   wherein the plurality of first conductive layers and the plurality of second conductive layers have opposite stress states.

2. The semiconductor device of claim 1, wherein top surfaces of the plurality of first conductive layers are rough.

3. The semiconductor device of claim 1, wherein thicknesses of the plurality of first conductive layers are greater than or equal to thicknesses of the plurality of second conductive layers.

4. The semiconductor device of claim 1, wherein thicknesses of the plurality of first conductive layers are between about 5 nm and about 50 nm and thicknesses of the plurality of second conductive layers are between about 10 nm and 150 nm.

5. The semiconductor device of claim 1, wherein sidewalls of the multi-layered connecting structure are vertical.

6. The semiconductor device of claim 1, further comprising first spacers positioned on sidewalls of the multi-layered connecting structure.

7. The semiconductor device of claim 1, further comprising porous spacers positioned on sidewalls of the multi-layered connecting structure.

8. The semiconductor device of claim 7, wherein a porosity of the porous spacers is between about 10% and about 90%.

9. The semiconductor device of claim 6, further comprising air gaps positioned between the sidewalls of the multi-layered connecting structure and the first spacers.

10. A method for fabricating a semiconductor device, comprising:
    providing a substrate;
    forming a multi-layered connecting structure above the substrate and comprising a plurality of first conductive layers alternatively formed with a plurality of second conductive layers; and
    forming a single-layered connecting structure above the substrate and having a top surface of the single-layered connecting structure coplanar with a top surface of the multi-layered connecting structure and a width of the single-layered connecting structure greater than a width of the multi-layered connecting structure;
    wherein the plurality of first conductive layers and the plurality of second conductive layers have opposite stress states.

11. The method for fabricating the semiconductor device of claim 10, wherein the step of forming the multi-layered connecting structure comprising:
    alternatively forming layers of first conductive material and layers of second conductive material above the substrate;
    forming a hard mask layer over the layers of first conductive material and the layers of second conductive material;
    patterning the hard mask layer;
    performing an etch process using the hard mask layer as a mask to turn the layers of first conductive material and the layers of second conductive material into the plurality of first conductive layers and the plurality of second conductive layers.

12. The method for fabricating the semiconductor device of claim 11, further comprising a step of forming first spacers on sidewalls of the multi-layered connecting structure.

13. The method for fabricating the semiconductor device of claim 11, further comprising a step of forming porous spacers on sidewalls of the multi-layered connecting structure.

14. The method for fabricating the semiconductor device of claim 13, wherein the step of forming the porous spacers comprising:
   forming a layer of energy-removable material covering the multi-layered connecting structure;
   performing an anisotropic etch process to turn the layer of energy-removable material into sacrificial spacers on the sidewalls of the multi-layered connecting structure;
   performing an energy treatment to turn the sacrificial spacers into the porous spacers.

15. The method for fabricating the semiconductor device of claim 14, wherein an energy source of the energy treatment is heat, light, or a combination thereof.

16. The method for fabricating the semiconductor device of claim 15, wherein the layer of energy-removable material comprises a base material and a decomposable porogen material, and the base material comprises methylsilsesquioxane, low-dielectric materials, or silicon oxide.

* * * * *